US009048291B2

(12) United States Patent
Inoue et al.

(10) Patent No.: US 9,048,291 B2
(45) Date of Patent: Jun. 2, 2015

(54) METHOD OF MANUFACTURING A SEMICONDUCTOR DEVICE HAVING MULTI-LAYERED INTERCONNECT STRUCTURE

(71) Applicant: Renesas Electronics Corporation, Kanagawa (JP)

(72) Inventors: Naoya Inoue, Kanagawa (JP); Kishou Kaneko, Kanagawa (JP); Yoshihiro Hayashi, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 14/300,836

(22) Filed: Jun. 10, 2014

(65) Prior Publication Data

US 2014/0295657 A1    Oct. 2, 2014

Related U.S. Application Data

(63) Continuation of application No. 13/682,297, filed on Nov. 20, 2012, now Pat. No. 8,779,594.

(30) Foreign Application Priority Data

Dec. 16, 2011    (JP) .................................. 2011-275182

(51) Int. Cl.
*H01L 21/4763* (2006.01)
*H01L 21/768* (2006.01)
(Continued)

(52) U.S. Cl.
CPC .... *H01L 21/76814* (2013.01); *H01L 29/66477* (2013.01); *H01L 29/78* (2013.01);
(Continued)

(58) Field of Classification Search
CPC ............ H01L 21/768; H01L 21/76814; H01L 21/76879; H01L 23/52; H01L 23/522; H01L 23/5226
USPC .................. 438/622, 624, 637, 151, 155, 164
See application file for complete search history.

(56) References Cited

U.S. PATENT DOCUMENTS 5,936,280 A    8/1999    Liu
6,022,766 A    2/2000    Chen et al.
(Continued)

FOREIGN PATENT DOCUMENTS

JP    S63-54763    3/1988
JP    2000-114453  4/2000
(Continued)

OTHER PUBLICATIONS

Yabuta et al., "High-mobility thin-film transistor with amorphous InGaZnO4 channel fabricated by room temperature rf-magnetron sputtering", Applied Physics Letters 89, 112123 (2006), American Institute of Physics 2006.
(Continued)

*Primary Examiner* — Kevin M Picardat
(74) *Attorney, Agent, or Firm* — Young & Thompson

(57) ABSTRACT

Disclosed is a semiconductor device provided with an active element in a multilayer interconnect layer and decreased in a chip area. A second interconnect layer is provided over a first interconnect layer. A first interlayer insulating layer is provided in the first interconnect layer. A semiconductor layer is provided in a second interconnect layer and in contact with the first interlayer insulating layer. A gate insulating film is provided over the semiconductor layer. A gate electrode is provided over the gate insulating film. At least two first vias are provided in the first interconnect layer and in contact by way of upper ends thereof with the semiconductor layer.

12 Claims, 17 Drawing Sheets

(51) Int. Cl.
*H01L 29/66* (2006.01)
*H01L 29/78* (2006.01)
*H01L 29/861* (2006.01)
*H01L 23/522* (2006.01)
*H01L 23/532* (2006.01)
*H01L 49/02* (2006.01)

(52) U.S. Cl.
CPC .............. *H01L 29/861* (2013.01); *H01L 28/60* (2013.01); *H01L 23/522* (2013.01); *H01L 23/53223* (2013.01); *H01L 23/5329* (2013.01); *H01L 21/76879* (2013.01)

(56) References Cited

U.S. PATENT DOCUMENTS

| | | | |
|---|---|---|---|
| 6,037,216 A | 3/2000 | Liu et al. | |
| 6,153,458 A | 11/2000 | Zamanian et al. | |
| 7,626,257 B2 | 12/2009 | Knorr | |
| 7,667,274 B2 | 2/2010 | Nakajima et al. | |
| 7,683,404 B2 | 3/2010 | Jang et al. | |
| 7,846,800 B2 | 12/2010 | Tan et al. | |
| 7,977,748 B2 | 7/2011 | Kito et al. | |
| 8,168,530 B2 * | 5/2012 | Jeong et al. | 438/622 |
| 8,183,634 B2 | 5/2012 | Park et al. | |
| 8,263,977 B2 | 9/2012 | Inoue et al. | |
| 8,362,565 B2 | 1/2013 | Kuroda | |
| 8,378,341 B2 | 2/2013 | Hayashi et al. | |
| 8,803,285 B2 | 8/2014 | Ohtake et al. | |
| 2006/0170046 A1 | 8/2006 | Hara | |
| 2006/0246709 A1 * | 11/2006 | Kim et al. | 438/618 |
| 2010/0148171 A1 | 6/2010 | Hayashi et al. | |
| 2010/0283055 A1 | 11/2010 | Inoue et al. | |
| 2011/0156026 A1 | 6/2011 | Yamazaki et al. | |
| 2012/0009725 A1 | 1/2012 | Inoue et al. | |
| 2012/0267690 A1 | 10/2012 | Endo et al. | |
| 2013/0082235 A1 * | 4/2013 | Gu et al. | 257/9 |
| 2013/0122672 A1 | 5/2013 | Or-Bach et al. | |
| 2013/0134418 A1 | 5/2013 | Hayashi et al. | |
| 2013/0135325 A1 | 5/2013 | Govil | |

FOREIGN PATENT DOCUMENTS

| | | |
|---|---|---|
| JP | 2004-088121 | 3/2004 |
| JP | 2006-261178 | 9/2006 |
| JP | 2007-152932 | 6/2007 |
| JP | 2007-157932 | 6/2007 |
| JP | 2007-305654 | 11/2007 |
| JP | 2008-262962 | 10/2008 |
| JP | 2009-218534 | 9/2009 |
| JP | 2010-093030 | 4/2010 |
| JP | 2010-135585 | 6/2010 |
| JP | 2010-141230 | 6/2010 |
| WO | WO 2007/063966 | 6/2007 |

OTHER PUBLICATIONS

Japanese Official Action—2011-275182—Mar. 31, 2015.

* cited by examiner

METHOD OF MANUFACTURING A SEMICONDUCTOR DEVICE HAVING MULTI-LAYERED INTERCONNECT STRUCTURE

CROSS-REFERENCE TO RELATED SPECIFICATIONS

This application is a continuation of application Ser. No. 13/682,297 filed on Nov. 20, 2012, which claims foreign priority to Japanese Patent Application No. 2011-275182 filed on Dec. 16, 2011. The entire contents are incorporated herein by reference.

BACKGROUND

The present invention concerns a semiconductor device and a method of manufacturing the semiconductor device.

Along with refinement of interconnects in semiconductor devices in recent years, various structures of semiconductor devices have been proposed.

Japanese Unexamined Patent Application Publication No. 2010-141230 describes the following semiconductor device. A first interconnect and a gate electrode are provided in an insulating layer of a first interconnect layer. A gate insulating film is provided in contact with the gate electrode over the first interconnect layer. A semiconductor layer is provided over the gate insulating film. The semiconductor device comprises the gate electrode, the gate insulating film, and the semiconductor layer. Thus, an element having a new function can be formed in the interconnect layer.

WO 2007/063966 describes the following semiconductor device using an oxide semiconductor. An n-type oxide semiconductor layer is provided over a substrate. In the n-type oxide semiconductor layer, an oxide conductor layer is provided over both sides of a channel portion. A gate insulating film is provided over the n-type oxide semiconductor layer and the oxide conductor layer. A gate electrode is provided over the gate insulating film. It is described that this can improve the production yield.

Japanese Unexamined Patent Application Publication No. 2007-157932 describes the following semiconductor device. An integrated circuit is formed over a semiconductor substrate. An insulation having a concave portion is provided over the integrated layer circuit. An amorphous semiconductor layer (substantially single crystal semiconductor particle) is formed so as to cover the insulating layer and the concave portion. In the amorphous semiconductor layer, a source region and a drain region are formed at positions isolated from each other by ion implantation. A gate insulating film is provided over the amorphous semiconductor layer. Over the gate insulating film, a gate electrode is provided in a region positioned between the source region and the drain region in a plan view. The source electrode and the drain electrode are provided in an interconnect layer above the amorphous semiconductor layer. That is, the source electrode and the drain electrode are in contact with the amorphous semiconductor layer on the side identical with the gate electrode. It is described that increase in the chip area can be suppressed. It is further disclosed that the amorphous semiconductor layer or substantially single crystal semiconductor particle comprises Si. This document does not disclose a case where the amorphous semiconductor layer comprises other materials.

A semiconductor device having an amorphous $InGaZnO_4$ film sputtered at a low temperature is disclosed in "High-mobility thin-film transistor with amorphous $InGaZnO_4$ channel fabricated by room temperature rf-magnetron sputtering", Hisao Yabuta, et al. in App. Phys. Lett., Vol. 89, 112123 (2006)).

SUMMARY

Semiconductor devices in which a semiconductor element is provided in a multi-interconnect layer is disclosed, for example, as in JP-A No. 2010-141230, WO 2007/063966, and JP-A 2007-157932 described above. The present inventors have found that a semiconductor element can be provided in a multilayer interconnect layer also in various structures of multilayer interconnect layers not disclosed in such patent documents.

According to one aspect of the present invention, a semiconductor device includes: a substrate; a first interconnect layer provided over the substrate; a second interconnect layer provided over the first interconnect layer; a first interlayer insulating layer provided in the first interconnect layer; a semiconductor layer provided in the second interconnect layer and in contact with the first interlayer insulating layer; a gate insulating film provided over the semiconductor layer; a gate electrode provided over the gate insulating film; and at least two first vias provided in the first interconnect layer and in contact by way of upper ends thereof with the semiconductor layer.

According to another aspect of the present invention, a method of manufacturing a semiconductor device includes: forming a first interlayer insulating layer over a substrate; forming at least two first vias in the first interlayer insulating layer; forming a semiconductor layer so as to be in contact with the first interlayer insulating layer and the first vias and overlap with the first vias in a plan view; forming a gate insulating film over the semiconductor layer; and forming a gate electrode over the gate insulating film.

According to still another aspect of the invention, the semiconductor layer, the gate insulating film, the gate electrode, and the first vias provided in the multilayer interconnect layer form an active element. Accordingly, it is possible to provide a semiconductor device in which an active element is provided in the multilayer interconnect layer, thereby decreasing the chip area.

According to the aspects of the present invention, there can be provided a semiconductor device in which an active element is formed in a multilayer interconnect layer, and the chip area is decreased.

DETAILED DESCRIPTION

Figure 1:
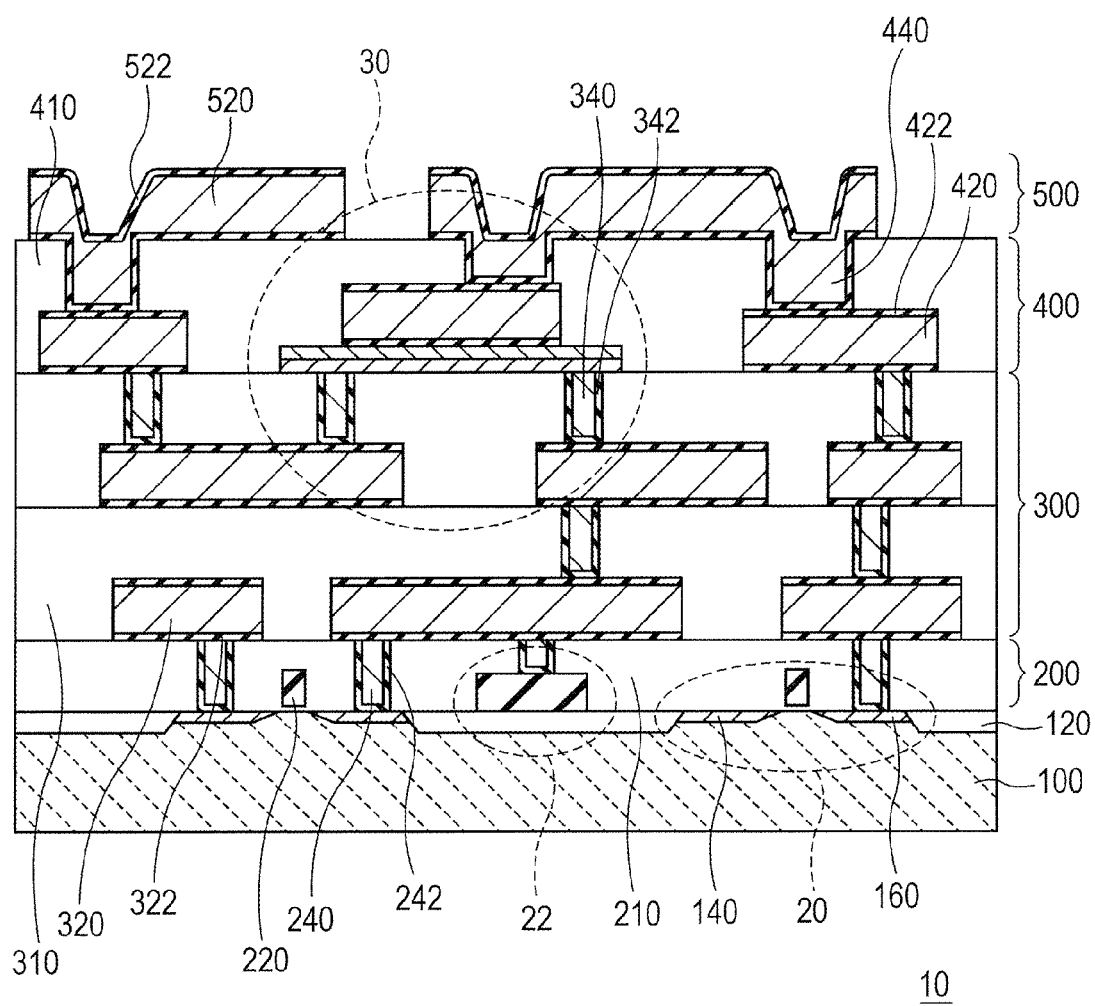
FIG. 1 is a cross sectional view showing a configuration of a semiconductor device according to a first embodiment.

Preferred embodiments of the invention are to be described with reference to the drawings. Throughout the drawings, identical constituent elements carry same reference numerals for which descriptions are omitted optionally.

First Embodiment

A semiconductor device 10 according to a first embodiment is to be described with reference to FIG. 1 and FIG. 2. The semiconductor device 10 has the following configuration. A first interconnect layer 300 is provided over a substrate 100. A second interconnect layer 400 is provided over the first interconnect layer 300. A first interlayer insulating layer 310 is provided to the first interconnect layer 300. A semiconductor layer 460 is provided in the second interconnect layer 400 and in contact with the first interlayer insulating layer 310. A gate insulating film 470 is provided over the semiconductor layer 460. A gate electrode 450 is provided over the gate insulating film 470. At least two first vias 340 are provided in the first interconnect layer 300 and in contact by way of upper ends thereof with the semiconductor layer 460. The structure is to be described specifically.

At first, an entire structure of the semiconductor device 10 is to be described with reference to FIG. 1. FIG. 1 is a cross sectional view showing a configuration of the semiconductor device 10 according to the first embodiment.

A substrate 100 is, for example, a semiconductor substrate. Specifically, the substrate 100 is, for example, an Si substrate. The substrate 100 may also be a compound semiconductor substrate. A device isolation region 120 having a plurality of openings is provided to the substrate 100. A first transistor 20 is provided in the opening of the device isolation region 120.

The first transistor 20 forms an internal circuit of the semiconductor device 10. "Internal circuit" referred to herein is, for example, a logic circuit. The first transistor 20 is, for example, an FET (Field Effect Transistor) that forms the logic circuit. The logic circuit comprises, for example, a plurality of the first transistors 20.

A source region 140 and a drain region 160 implanted with impurities are formed in the opening of the device isolation region 120. An extension region (not illustrated) may also be formed to the source region 140 and the drain region 160. A gate insulating film (with no reference numeral) is provided over a channel region (with no reference numeral) put between the source region 140 and the drain region 160. A gate electrode 220 is provided over the gate insulating film. The gate electrode 200 is composed, for example, of polysilicon. The gate electrode 220 is provided in a lower interconnect layer 200

A side wall insulation film (not illustrated) is formed to the gate insulating film and on the side wall of the gate electrode 220. A liner insulating layer (not illustrated) may also be formed over the source region 140, the drain region 160, the gate electrode 220, and the side wall insulation layer.

As described above, the first transistor 20 is provided near the surface layer of the substrate 100. As to be described later, an active element 30 is provided in the multilayer interconnect in the inside of the same semiconductor device 10 as that for the first transistor 20. Thus, the semiconductor device 10 can be made multi-functional and the area of the semiconductor device 10 can be decreased.

A lower interlayer insulating layer 210 is provided in the lower interconnect layer 200. Further, contact plugs 240 are formed in the lower interconnect layer 200. A barrier metal layer 242 is provided at the bottom and on the lateral side of the contact plug 240. The contact plug 240 is in contact, for example, with the gate electrode 220, the source region 140, or the drain region 160. A silicide layer (not illustrated) may also be provided to a portion where the contact plug 240 is in contact with the source region 140 or the drain region 160. The lower interlayer insulating layer 210 may be formed of a material identical with that of the first interlayer insulating layer 310 to be described later.

Further, a resistance element 22 formed of the same material as that of the gate electrode 220 may also be provided in the lower interconnect layer 200. The resistance element 22 is provided, for example, over the device isolation electrode 120.

A plurality of first interconnect layers 300 are provided over the lower interconnect layer 200. A first interlayer insulation film 310, a first interconnect 320, and a first via 340 are provided in each of the first interconnect layers 300.

The first interlayer insulating layer 310 is in contact with the lower interlayer insulating layer 210 of the lower interconnect layer 200, or the first interlayer insulating layer 310 in the first interconnect layer 300 of the lower layer. The first interlayer insulating layer 310 is formed of a silicon oxide film ($SiO_2$) or a Low-k film having a specific dielectric constant lower than that of the silicon oxide film. For example, the specific dielectric constant of the first interlayer insulating layer 310 is 3.2 or less. Thus, the capacitance of the semiconductor device 10 can be lowered. The first interlayer insulating layer 310 comprises at least Si and O. Further, the first interlayer insulating layer 310 may also comprise other element such as N, C, or F. Specifically, the first interlayer insulating layer 310 comprises, for example, a film of $SiO_2$, SiN, SiON, SiOC, SiOCH, SiCOH, or SiOF. Further, the interlayer insulating layer 310 may also be a film, for example, of HSQ (Hydrogen Silsesquioxane) film, MSQ (Methyl Silsesquioxane) or other organic polymers. Further, the first interlayer insulating layer 310 may be a porous film comprising the material described above.

The first interconnect 320 is in contact, for example, with the lower interlayer insulating layer 210 of the lower interconnect layer 200 or the first interlayer insulating layer 310 of the first interconnect layer 300 of the lower layer. The first interconnect 320 is connected by way of the first via 340 in the identical first interconnect layer 300 to the interconnect of the upper layer (for example, first interconnect 320). Further, the first interconnect 320 in the first interconnect layer 300 at the layer is connected to the gate electrode 220, the source region 140, or the drain region 160 by way of a contact plug 240. A barrier metal layer 322 is formed at the upper layer and the lower layer of the first interconnect 320. By providing the barrier metal layer 322 at the upper layer, generation of Al hillock can be suppressed when the interconnect (first interconnect 320, etc.) comprises Al. Further, upon exposure in the step of patterning the interconnect (first interconnect 320, etc.), the barrier metal layer 322 provided at the upper layer can be functioned as an anti-reflection film. On the other hand, by providing the barrier metal layer 322 at the lower layer, adhesion between the interconnect (first interconnect 320, etc.) and the lower interlayer insulating layer 210 can be improved. In this embodiment, the first interconnect 320 comprises, for example, Al. Further, the barrier metal 322 comprises, for example, a film of a elemental metal such as Ti, Ta, or W, or a nitride thereof, or a stacked film of the elemental metal film and the nitride film. For example, the barrier metal layer 322 at the upper layer comprise TiN/Ti and the barrier metal layer 322 at the lower layer comprise TiN/Ti. It is not necessary that the material film for the barrier metal layer 322 is identical between the upper layer and the lower layer and, for example, the upper barrier metal layer may comprise TiN/Ti and the lower barrier layer may comprise TiN.

The first via 340 is provided over the first interconnect 320. The lower surface of the first via 340 is in contact with the upper layer of the first interconnect 320. A barrier metal layer 342 is formed at the bottom and on the lateral side of the first via 340. In this embodiment, the first via 340 comprises, for example, W. Further, the barrier metal layer 342 comprises a film of a high melting metal such as Ti, Ta, or a nitride thereof, or a stacked film thereof. Further, the first via 340 may also comprise Cu.

The second interconnect layer 400 is provided over the first interconnect layer 300. Further, a second interlayer insulating layer 410, second interconnects 420, a gate electrode 450, a semiconductor layer 460, and a gate insulating film 470 are provided in the second interconnect layer 400. The semiconductor layer 460, the gate insulating film 470, the gate electrode 450, and the first via 340 form an active element 30 to be described later.

The second interlayer insulating layer 410 is formed, for example, of a Low-k film having a low specific dielectric constant in the same manner as the first interlayer insulating layer 310. The second interlayer insulating layer 410 is formed, for example, of the same material as that of the first interlayer insulating layer 310. Both of the first interlayer insulating layer 310 and the second interlayer insulating layer 410 may also be composed of a silicon oxide film ($SiO_2$). On the other hand, the second interlayer insulating layer 410 may be composed of a material different from that of the first interlayer insulating layer 310.

Figure 2A:
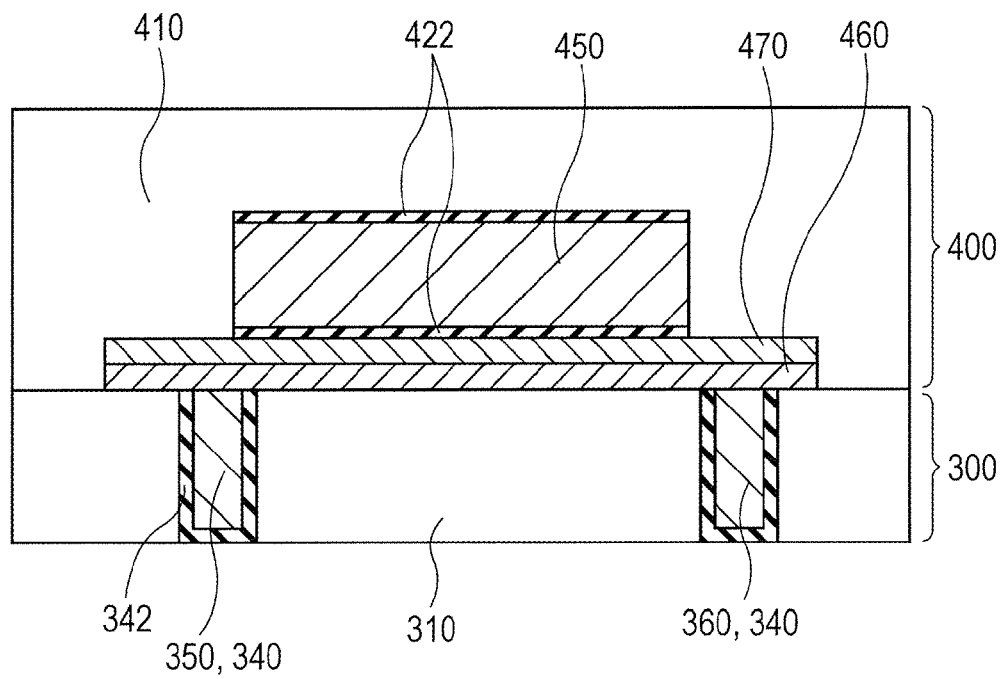
FIG. 2A is a cross sectional view of the active element according to the first embodiment.
Figure 2B:
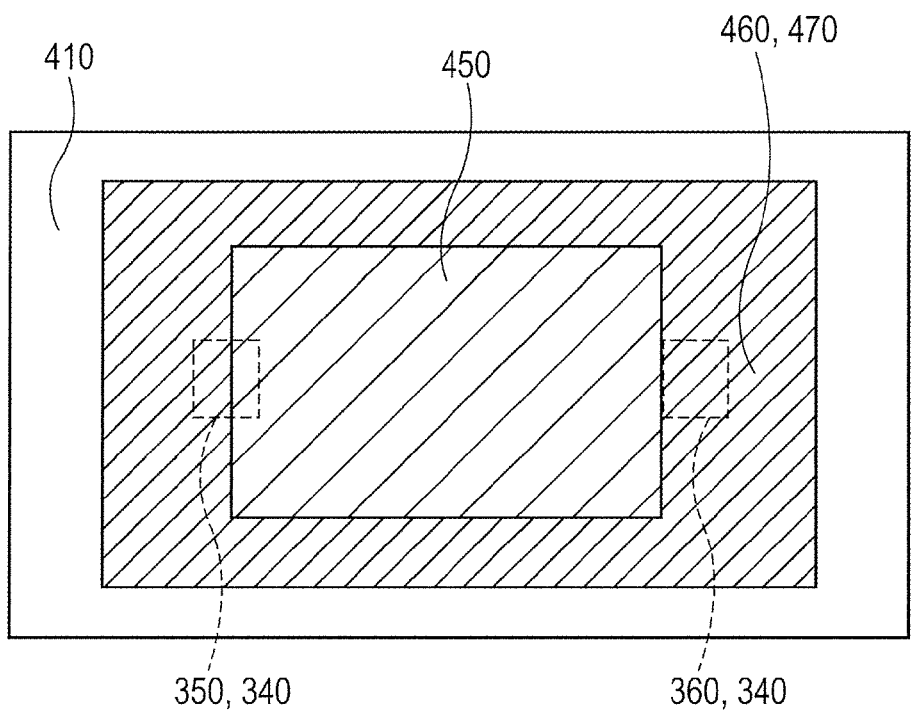
FIG. 2B is a plan view of the active element according to the first embodiment.

The active element 30 is to be described with reference to FIG. 2. FIG. 2 is a view showing a configuration of the active element 30 according to the first embodiment. FIG. 2A is a cross sectional view of the active element 30. FIG. 2B is a plan view of the active element 30.

The semiconductor layer 460 is provided in the second interconnect layer 400 and is in contact with the first interlayer insulation film 310. The semiconductor layer 460 is, for example, an oxide semiconductor. Specifically, the semiconductor layer 460 comprises, for example, InGaZnO, ZnO, NiO, CuO, $Cu_2O$, SnO, or $SnO_2$. "Semiconductor layer 460 comprises InGaZnO, etc." means herein, for example, a case where the semiconductor layer 460 comprises the compound described above, a case where the semiconductor layer 460 contains a portion or a region comprising the compound, a case where the semiconductor layer 460 contains the composition of the compound. The material of the semiconductor layer 460 described above can be deposited at a low temperature of 400° C. or lower. Thus, the semiconductor layer 460 can be formed in the multilayer interconnect layer without giving damages to other interconnect layers. However, the semiconductor layer 460 is not restricted thereto but any metal oxide is applicable so long as it has a resistivity of 100 Ωcm or less.

The thickness of the semiconductor layer 460 is not particularly restricted and, for example, it is preferably 10 nm or more and 100 nm or less. When the thickness is at the lower limit value described above or more, the ON/OFF operation can be realized with no application of an excess voltage to the gate electrode 450. That is, the component can be served as the active element 30. When the thickness is at the upper limit value or less, no undesired effect such as cracking does not occur in other interconnect layers due to the stress of the semiconductor layer 460.

Further, the lower surface of the semiconductor layer 460 is in contact with the upper surface of the first via 340. At least two first vias 340 are provided in the first interconnect layer 300 and in contact by way of the upper ends thereof with the semiconductor layer 460. One of the first vias 340 provided at least by two is a source electrode 350. The other of the first vias 340 is a drain electrode 360 positioned on the side opposing the source electrode 350 with a portion of the gate electrode 450 being put therebetween in a plan view.

When the semiconductor layer 460 is an oxide semiconductor, a source region (with no reference numeral) and a drain region (with no reference numeral) in the semiconductor layer 460 is formed, for example, by introducing an oxygen vacancy. On the other hand, the source region and the drain region may also be formed by implanting an impurity into the semiconductor layer 460.

Further, when the semiconductor layer 460 is an oxide semiconductor, an oxygen depletion layer (not illustrated) may be formed to a portion of the semiconductor layer 460 in contact with the first via 340. "Oxide depletion layer" referred to herein means a layer in which an oxygen concentration is relatively lower in the semiconductor layer 460. In the oxide semiconductor, a resistance tends to be lower as the oxygen concentration is lower. Thus, a contact resistance between the upper surface of the first via 340 and the semiconductor layer 460 can be lowered. Presence of the oxygen depletion layer can be confirmed by a transmission electron microscope (TEM) and electron energy loss spectroscopy (EELS). Specifically, a cross section of the semiconductor layer 460 over the first via 340 is observed by TEM, and EELS measurement is performed to the region. Thus, a layer in which the oxygen concentration is relatively lower in the semiconductor layer 460 can be confirmed.

The oxygen depletion layer is formed, for example, as below. At first, the first via 340 is formed. Then, a plasma treatment is applied to the upper surface of the first via 340 by an inert gas. The inert gas is, for example, an Ar or He gas. Thus, the upper surface of the first via 340 is activated. Then, the semiconductor layer 460 is formed so as to be in contact with the upper surface of the first via 340. In this step, the activated surface of the first via 340 is joined with a portion of oxygen in the oxide semiconductor. This can form an oxygen depletion layer of high electroconductivity near the portion in the oxide semiconductor layer in contact with the first via 340. Accordingly, since the semiconductor layer 460 has the oxygen depletion layer, the first via 340 and the semiconductor layer 460 can be connected at a low resistance. The oxygen depletion layer may also be the source region and the drain region in the semiconductor layer 460 described above. The manufacturing step is to be described again specifically.

The first via 340 may be protruded out of the semiconductor layer 460 in a plan view. In other words, it may suffice that the first vias 340 as the source electrode 350 and the drain electrode 360 at least has a region overlapping with the semiconductor layer 460 in a plan view.

The distance between the source electrode 350 and the drain electrode 360 is, for example, 30 nm or more and 10 µm or less. When the distance is within the range described above, the active element 30 can be operated stably.

The first interconnect insulating layer 310 and the first vias 340 in contact with the semiconductor layer 460 are planarized, for example, by CMP (Chemical Mechanical Polishing). In other words, the upper surface of the first interlayer insulation film 310 and the upper surface of the first vias 340 in contact with the semiconductor layer 460 are in flush with each other. If the semiconductor layer 460 is formed, for example, over the first insulating layer 310 having a step, the structure of the semiconductor layer 460 is disturbed on the lateral wall of the step. Accordingly, this may possibly degrade the characteristic of the semiconductor layer 460. On the other hand, when the semiconductor layer 460 is formed over the planarized surface, degradation of the characteristic of the semiconductor layer 460 can be suppressed.

The gate insulating film 470 is provided over the semiconductor layer 460. The dielectric constant of the gate insulating film 470 is higher, for example, than that of the first interlayer insulation film 300. Further, the dielectric constant of the gate insulating film 470 is higher, for example, than that of the second interlayer insulating layer 410. Thus, the thickness of the gate insulating film 470 can be increased to suppress a leak current. Specifically, the gate insulating film 470 comprises, for example, $SiO_2$ or SiN. The gate insulating film 470 is not restricted to them but may comprise a metal oxide or a metal silicate comprising Hf, Zr, Al, Ti or Ta and having an insulative property. Specifically, the gate insulating film 470 comprises, for example, $HfO_2$, $ZrO_2$. $Al_2O_3$, $TiO_2$, $HfSiO_x$, $ZrSiO_x$, $AlSiO_x$, and $TiSiO_x$.

The thickness of the gate insulating film 470 is, for example, 0.5 nm or more and 100 nm or less. When the thickness of the gate insulating film 470 is within the range described above, the active element 30 can be operated stably.

The gate region of the insulating film 470 may be equal with or larger than the region of the gate electrode 450 in a plan view. In this embodiment, the gate insulating film 470 is formed so as to overlap with the semiconductor layer 460 in a plan view. In other words, the semiconductor layer 460 is formed by etching using the gate insulating film 470 as a mask. Accordingly, the lateral side of the gate insulating film 470 is formed in flush with the lateral side of the semiconductor layer 460.

The gate electrode 450 is provided over the gate insulating film 470. The gate electrode 450 comprises, for example, Al. The gate electrode 450 may also be an Al alloy. Thus, the gate electrode 450 can be fabricated finely by dry etching.

In FIG. 1, the second interconnects 420 are provided in the second interconnect layer 400 and formed at positions different from the gate electrode 450 in a plan view. The gate electrode 450 comprises a layer formed of the same material as that of the second interconnect 420. That is, the second interconnects 420 are formed simultaneously at least with a portion of the gate electrode. It is assumed a case of not including interconnects in the same layer as the active element 30 as in JP-A 2007-157932. In this case, the active element 30 is present between the interconnect of the upper layer and the interconnect of the lower layer. Therefore, the distance between the interconnect of the upper layer and the interconnect of the lower layer tends to be increased in a plan view and in a cross sectional view. Accordingly, there may be a possibly that connection between the interconnect of the upper layer and the interconnect of the lower layer becomes difficult. Further, there may be also a possibility of increasing the capacitance of the interconnect. On the contrary, in the first embodiment of the invention, the gate electrode 450 comprises a layer formed of the same material as that of the second interconnect 420. Therefore, the active element 30 can be formed in the multilayer interconnect without greatly changing the multilayer interconnect structure or the manufacturing process. In the first embodiment, the material of gate electrode 450 is identical with that of the second interconnect 420. The gate electrode 450 may also comprise a material suitable to the active element 30. Further, the gate electrode 450 may have a gate contact layer (to be described later) in contact with the gate insulating film 470$_o$ Actually, a barrier metal layer 422 is provided to the upper layer and the lower layer of the second interconnect 420 and the selection of material is important for the barrier metal layer 422 of the lower layer in contact with the gate insulating film 470. For example, the barrier metal layer 422 of the lower layer may be a material conditioned for the work function conforming to the semiconductor layer 460. That is, the barrier metal layer 422 of the lower layer may also be a gate contact layer 454 to be described in a fifth embodiment. In this case, the barrier metal layer 422 of the lower layer comprises, for example, TiN, TiN/Ti, TiAlN, TaN/TiN, TiN/TaN, etc.

Figure 4A:
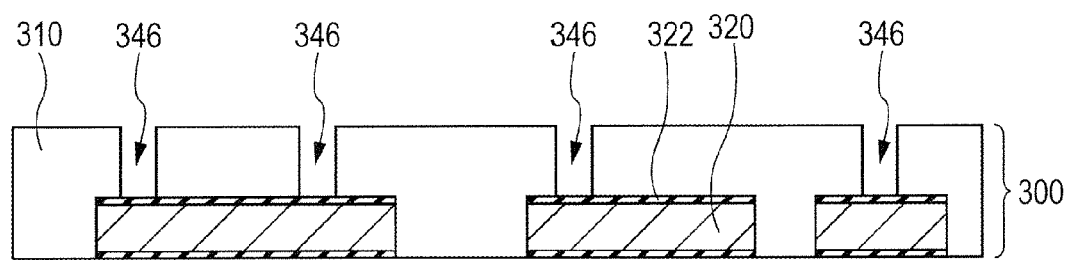
FIGS. 4A and 4B are a cross sectional views for explaining a method of manufacturing the semiconductor device according to the first embodiment.

As shown in FIG. 4A, first vias 340 each as a source electrode 350 and a drain electrode 360 are provided in the layer below a semiconductor layer 460. In other words, first vias 340 each as the source electrode 350 and the drain electrode 360 are provided in the first interconnect layer 300 positioned below the second interconnect layer 400 provided with a gate electrode 450. Thus, the distance between the source electrode 350 and the drain electrode 360 can be made narrower than the width of the gate electrode 450. In this case, a so-called "channel length" is a distance between the source electrode 350 and the drain electrode 360.

As shown in FIG. 2B, at least one of the first vias 340 partially overlaps with a portion of the gate electrode 450 in a plan view. When the distance between the source electrode 350 and the drain electrode 360 is made narrower than the width of the gate electrode 450, the characteristic of an active element 30 can be improved. Specifically, a large drain current can be obtained at a low threshold voltage.

As described above, the semiconductor layer 460, the gate insulating film 470, the gate electrode 450, and the first vias 340 form the active element 30. One of the first vias 340 is the source electrode and the other of them is the drain electrode. Accordingly, the active element 30 of the first embodiment is, for example, an FET. The active device element 30 of the first element is referred to as "second transistor".

In FIG. 1, the first transistor 20 overlaps with a portion of the semiconductor layer 460 in a plan view. That is, the first transistor 20 overlaps with a portion of the active element 30 in a plan view. Thus, the area of the semiconductor device 10 can be decreased.

Then, a structure in the layers above the semiconductor layer 460 is to be described. A second interlayer insulating layer 410 is provided in the second interconnect layer 400. The second interlayer insulating layer 410 is provided over the first interlayer insulating layer 310, the gate insulating film 470, and the gate electrode 450. Second vias 440 are provided in the second interconnect layer 400 and in contact by way of lower ends thereof with the gate electrode 450. Thus, the active element 30 can be connected further to the interconnect layer of the upper layer.

A third interconnect layer 500 is provided over the second interconnect layer 400. Third interconnects 520 are provided in the third interconnect layer 500. In this embodiment, the third interconnects 520 are provided at positions at least overlapping with the second vias 440 in the plan view, and formed integrally with the second vias 440. A barrier metal layer 522 is provided to the upper layer and the lower layer of the third interconnects 520. The identical barrier metal 522 is provided on the lateral side and the bottom of the second vias 440. The second vias 440 and the third interconnects 520 are formed, for example, of Al. As described above, since the third interconnects 520 are formed integrally with the second vias 440, an Al interconnect layer can be formed, for example, in the layer above the second interconnect layer. The Al interconnect layer requires no CMP step different from a Cu interconnect layer by a damascene process. Accordingly, since the embodiment has the configuration described above, the number of steps for manufacturing the semiconductor device can be saved.

Further, in the first embodiment, the interconnects at least in the lower interconnect layer 200, the first interconnect layer 300, and the second interconnect layer 400 do not contain Cu. Accordingly, a so-called diffusion blocking layer is not provided between each of them. "Diffusion blocking layer" referred to herein means an insulating layer for preventing Cu from diffusing into the interlayer insulating layer. Since the interconnect layer does not contain Cu as described above, the manufacturing steps can be simplified further.

In this embodiment, a plurality of interconnect layers may be further formed over the third interconnect layer 500. An electrode pad for supplying a power source voltage to an internal circuit (for example, pad 600 to be described later) may be formed in the uppermost interconnect layer of the multilayer interconnect layer. The internal circuit is connected, for example, by way of the second transistor to the electrode pad. Thus, the active element 30 which is the second transistor can be used as a power source switch.

Then, a method of manufacturing the semiconductor device 10 according to the first embodiment is to be described with reference to FIG. 3 to FIG. 8. FIG. 3 to FIG. 8 are cross sectional views for explaining the method of manufacturing the semiconductor device according to the first embodiment. The method of manufacturing the semiconductor device 10 according to the first embodiment has the following steps. A first interlayer insulating layer 310 is formed over a substrate 100. Then, at least two first vias 340 are formed in the first interlayer insulating layer 310. Then, a semiconductor layer 460 is formed so as to be in contact with the first interlayer insulating layer 310 and overlap with the first vias 340 in a plan view. Then, a gate insulating film 470 is formed over the semiconductor layer 460 (gate insulating film forming step). Then, a gate electrode 450 is formed over the gate insulating film 470 (gate electrode forming step). Details are to be described specifically.

Figure 3:
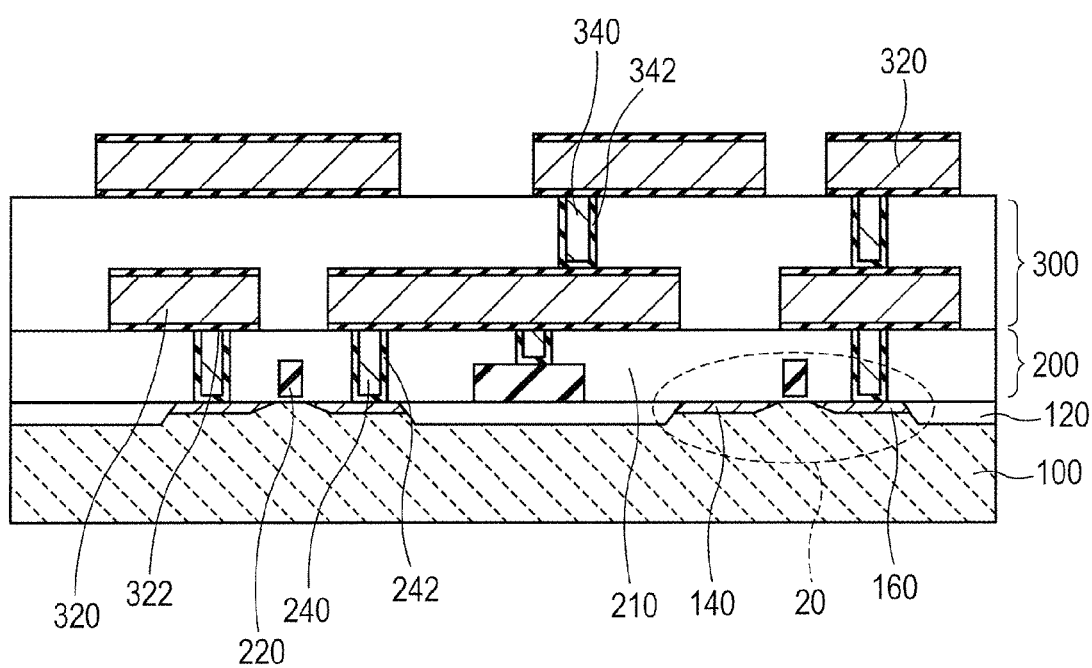
FIG. 3 is a cross sectional view for explaining a method of manufacturing the semiconductor device according to the first embodiment.

At first, a substrate 100 is prepared as shown in FIG. 3. The substrate 100 is, for example, a semiconductor substrate as described above. A device isolation region 120 having an opening (with no reference numeral) is formed to the substrate 100 by using the gate insulating film (with no reference numeral) and the gate electrode 220 as a mask. Then, a gate insulating film (with no reference numeral) and a gate electrode 220 are formed in the opening. Then, an extension region (with no reference numeral) is formed by ion-implantation of impurities into the substrate 100. Then, a side wall insulating film (not illustrated) is formed on the side wall of the gate insulating film (with no reference numeral) and the gate electrode 220. Then, by using them as a mask, impurities are implanted into the substrate 100 to form a source region 140 and a drain region 160. Thus, the first transistor 20 is formed.

Then, a lower interlayer insulating layer 210 is formed so as to cover the substrate 100, for example, by CVD (Chemical Vapor Deposition). Contact holes (not illustrated) are formed at positions, for example, overlapping with the source region 140 and the drain region 160 of the lower interlayer insulating layer 210 in a plan view. Then, a barrier metal layer 242 is formed to the contact holes. Then, a metal is filled in the contact hole, for example, by CVD. Then, the upper surface of the lower interlayer insulating layer 210 is planarized by CMP. Thus, contact plugs 240 are formed in the lower interconnect layer 200.

Then, first interconnects 320 each having a barrier metal layer 322 on the upper layer and the lower layer are formed over the lower interconnect layer 200. For example, they are deposited in the order of Ti, Al, and Ti. Then, the thin film is patterned to form the first interconnects 320 over the lower interconnect layer 200.

Then, a first interlayer insulating layer 310 is formed over the lower interconnect layer 200 and the first interconnects 320, for example, by CVD. Then, first via holes 346 are formed in the first interlayer insulating layer 310 by RIE (Reactive Ion Etching). Then, a barrier metal layer 342 is formed in the first via holes 346, for example, by sputtering. Then, a metal 344 is filled in the first via holes. In this embodiment, W is filled in the first via holes, for example, by CVD. Then, the upper surface of the first interlayer insulation film 310 is planarized by CMP. Thus, first vias 340 are formed in the first interconnect layer 300.

Then, a method of forming a structure at the periphery of as active element 30 is to be described with reference to Fog. 4. At or after FIG. 4, the configurations illustrated in FIG. 3 are omitted.

As shown in FIG. 4A, a first interlayer insulating layer 310 is formed over the first interconnect layer 300 and the first interconnect 320 in the lower layer. Then, at least two first via holes 346 are formed in the first interlayer insulating layer 310 by RIE.

Figure 4B:
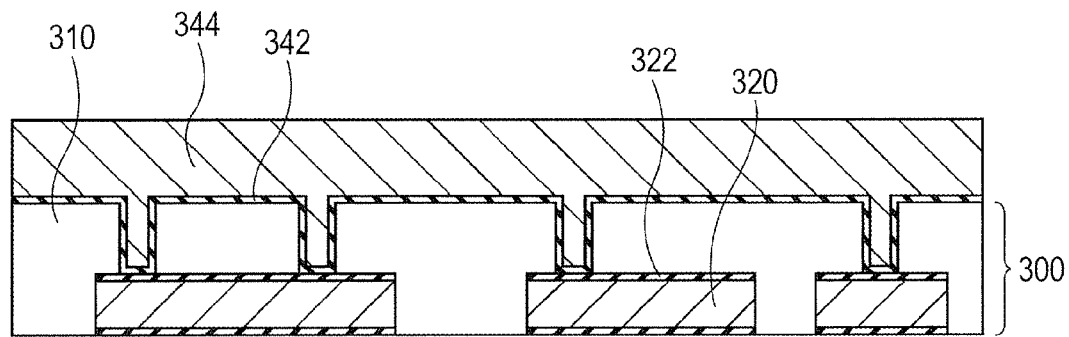

Then, as shown in FIG. 4B, a barrier metal 342 is formed in the first via holes 346, for example, by sputtering. Then, a metal 344 is filled in the first via holes 346. In this embodiment, W is filled as the metal 344 in the first via hole 345, for example, by CVD.

Figure 5A:
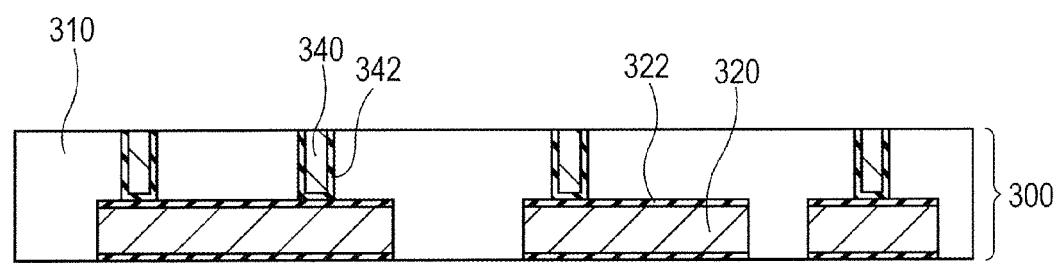
FIGS. 5A and 5B are cross sectional views for explaining a method of manufacturing the semiconductor device according to the first embodiment.

Then, as shown in FIG. 5A, the upper surface of the first interlayer insulating layer 310 is planarized by CMP. Thus, first vias 340 are formed in the first interconnect layer 300. In this step, the upper surface of the first interlayer insulating layer 310 and the upper surface of the first vias 340 are formed in flush with each other. Thus, the semiconductor layer 460 can be formed over the planar surface.

A step of applying a plasma treatment to the upper surface of the first vias 340 may be performed by using an inert gas after the step of forming the first vias 340 and before the step of forming the semiconductor layer 460 to be described later. The inert gas is, for example, an Ar gas or an He gas. This can activate the upper surface of the first vias 340. Further, the upper surface of the first vias 340 with deposition of impurities, etc. by CMP can be cleaned. Further, when the semiconductor layer 460 is an oxide semiconductor, a contact resistance between the upper surface of the first vias 340 and the semiconductor layer 460 can be lowered in conjunction with the step of forming the semiconductor layer 460 to be described later.

Figure 5B:
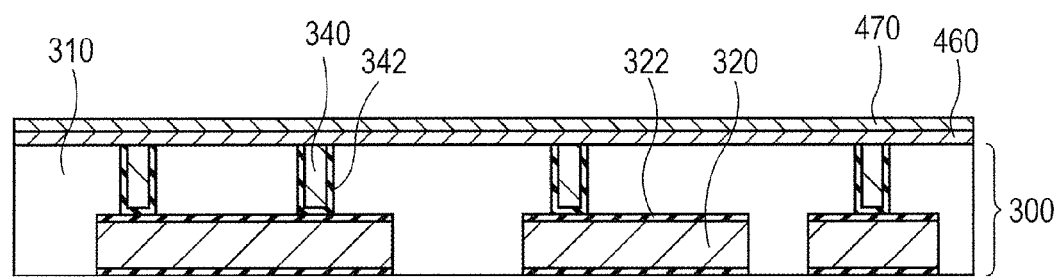

Then, as shown in FIG. 5B, a semiconductor layer 460 is formed over the first interconnect layer 300 so as to be in contact with the first interlayer insulating layer 310 and the first vias 340, and overlap with the first vias 340 in a plan view. An oxide semiconductor is formed as the semiconductor layer 460, for example, by sputtering. Specifically, InGaZnO, InZnO. ZnO, ZnAlO, ZnCuO, NiO, SnO, or CuO is formed, for example, as the semiconductor layer 460. In this step, the deposition temperature is, for example, 450° C. or lower. In the first embodiment, the semiconductor layer 460 is not patterned in this step but the semiconductor 460 is patterned after the gate insulating film forming step to be described later.

Then, when a step of subjecting the upper surface of the first vias 340 to a plasma treatment is performed and an oxide semiconductor is formed as the semiconductor layer 460, the activated surface of the first vias 340 is joined with a portion of oxygen in the oxide semiconductor. Thus, an oxygen depletion layer of high electroconductivity can be formed near the portion of the oxide semiconductor layer in contact with the first vias 340 can be formed. Accordingly, a contact resistance between the upper surface of the first vias 340 and the semiconductor layer 460 can be lowered.

Then, a gate insulating film 470 is formed over the semiconductor layer 460 (gate insulating film forming step). For example, $SiO_2$ or SiN is formed as the gate insulating film 470, for example, by sputtering. In addition, the gate insulating film may be formed also by plasma CVD, thermal CVD, ALD (Atomic Layer Deposition), etc.

Figure 6A:
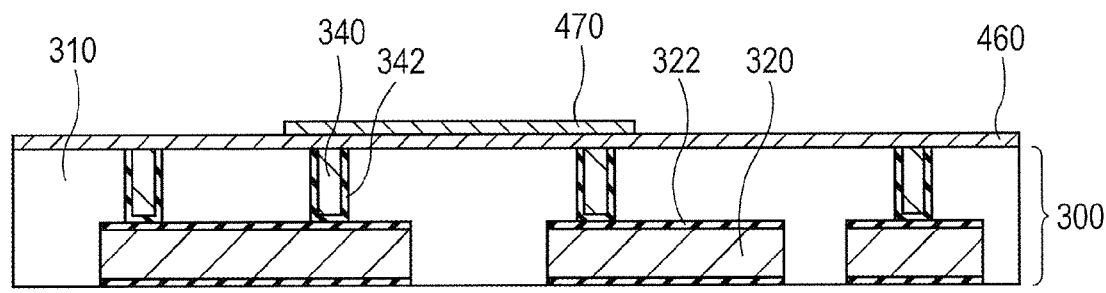
FIGS. 6A and 6B are cross sectional views for explaining a method of manufacturing the semiconductor device according to the first embodiment.

Then, as shown in FIG. 6A, in a step of forming the gate insulating film, a gate insulating film 470 is patterned so as to leave a portion overlapping with the first via 340 in a plan view. In this step, the gate insulating film 470 is patterned selectively, for example, under a condition where the gate insulating film 470 more tends to be etched than the semiconductor layer 460. In the dry etching using a $C_xF_y$-containing gas, the etching rate of the oxide semiconductor is low. When the semiconductor layer 460 is an oxide semiconductor, the gate insulating film 470 is dry etched by using, for example, the $C_xF_y$-containing gas. Thus, the gate insulating film 470 can be etched selectively.

Figure 6B:
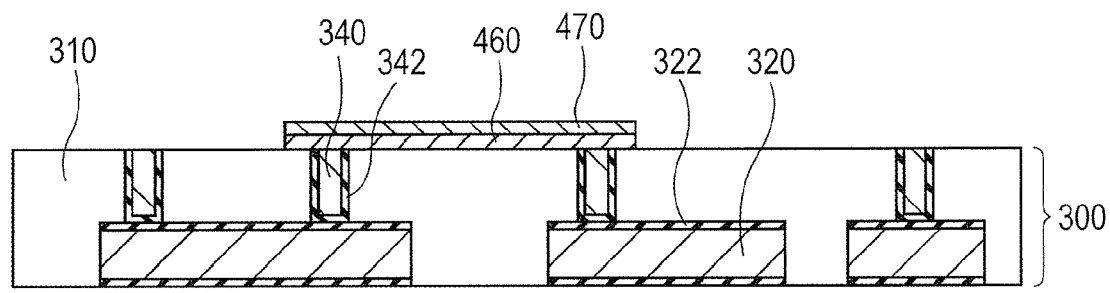

Then, as shown in FIG. 6B, the semiconductor layer 460 is selectively removed by using the patterned gate insulating film 470 as a mask after the step of forming the gate insulating film. In this step, the semiconductor layer 460 is patterned selectively under the condition that the semiconductor layer 460 more tends to be etched than the gate insulating film 470.

The oxide semiconductor is dry etched by a Cl-containing gas. In the dry etching using the Cl-containing gas, the etching rate of $SiO_2$, SiN, etc. is low. When the semiconductor layer 460 is an oxide semiconductor and the gate insulating film 470 is $SiO_2$, SiN, etc., the semiconductor layer 460 is dry etched by using, for example, the CL-containing gas. Thus, the semiconductor layer 460 can be etched selectively. The first interlayer insulating layer 310 of the first interconnect layer 300 is not etched by the etching.

Figure 7A:
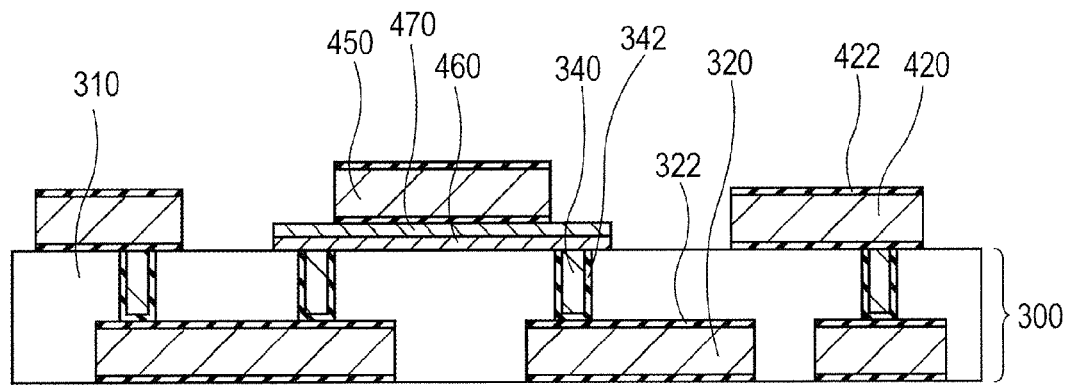
FIGS. 7A and 7B are cross sectional views for explaining a method of manufacturing the semiconductor device according to the first embodiment.

Then, as shown in FIG. 7A, a gate electrode 450 is formed over the gate insulating film 470 (gate electrode forming step). In the gate electrode forming step, second interconnects 420 are formed while being located at positions different from the gate electrode 450 in a plan view and formed simultaneously at least with a portion of the gate electrode 450. In this step, the second interconnects 420 are formed simultaneously with the entire portion of the gate electrode 450. Specifically, the gate electrode 450 and the second interconnects 420 are formed as described below. At first, a metal layer having a barrier metal layer 422 at the upper layer and the lower layer (gate electrode 450 and the second interconnects 420) is formed over the first interconnect layer 300 and the gate insulating film 470, for example, by sputtering. Specifically, a barrier metal layer 422 comprising Ti, TiN or Ti/TiN, and a metal layer comprising Al (gate electrode 450 and second interconnect 420) are formed. Then, a photoresist (not illustrated) is formed at a predetermined position over the metal layer. Then, dry etching is performed by using the photoresist layer as a mask. Thus, the gate electrode 450 and the second interconnect 420 are patterned simultaneously. This is identical with the step of forming only the second interconnects 420 except for the step of forming the semiconductor layer 460 and the gate insulating film 470 described above. Accordingly, the active element 30 can be formed in the multilayer interconnect layer without greatly changing the manufacturing process.

Figure 7B:
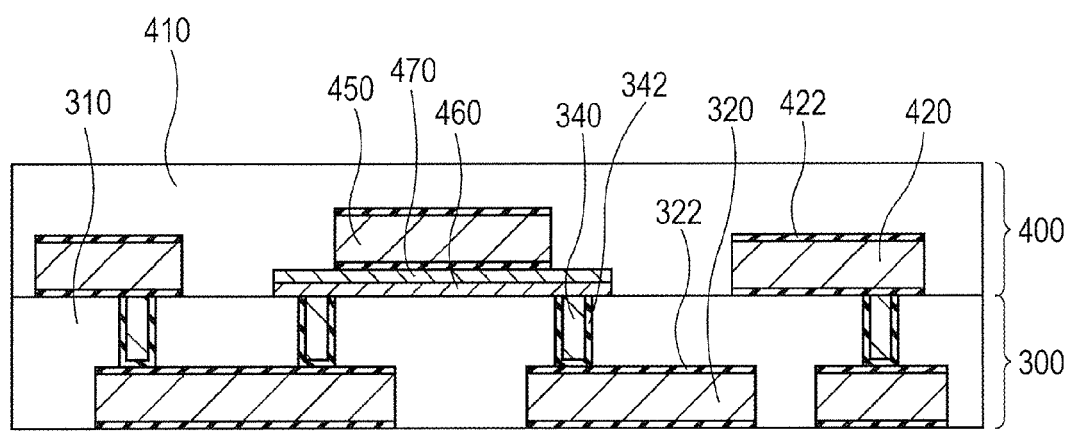

Then, as shown in FIG. 7B, a second interlayer insulating layer 410 is formed over the first interlayer insulating layer 310, the gate insulating film 470, and the gate electrode 450, for example, by CVD.

Figure 8A:
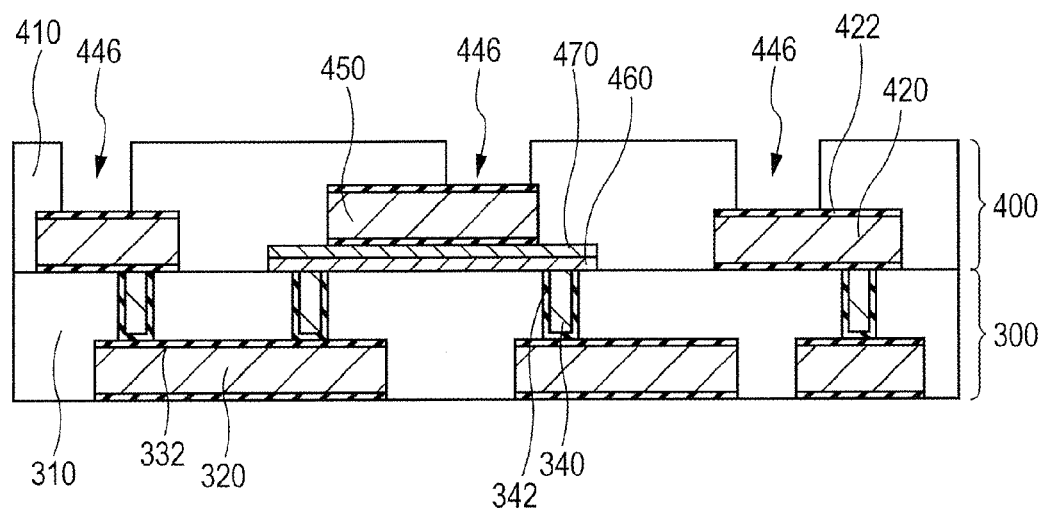
FIGS. 8A and 8B are cross sectional views for explaining a method of manufacturing the semiconductor device according to the first embodiment.

Then, as shown in FIG. 8A, second via holes 446 are formed in the second inter layer insulating layer 410 so as to be in contact with the gate electrode 450, for example, by RIE. The second via holes 446 are formed so as to be in contact with the second interconnect 420.

Figure 8B:
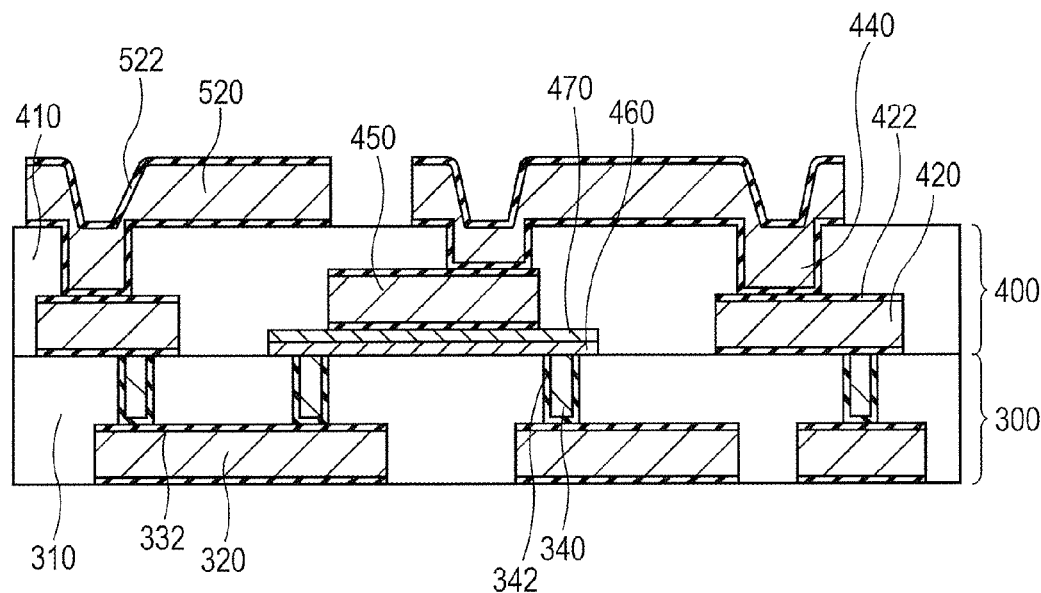

Then, as shown in FIG. 8B, second vias 440 in contact with the gate electrode 450 are formed by filling the second via holes 446, and third interconnects 520 positioned over the second interlayer insulating layer 410 are formed integrally with the second vias 440. Simultaneously, second vias 440 in contact with the second interconnect 420 are also formed simultaneously. Specifically, the gate electrode 450 and the second interconnect 420 are formed as described below. At first, a metal layer having a barrier metal layer 522 at the upper layer and the lower layer is formed over the second interlayer insulating layer 410 and in the second via holes 446, for example, by sputtering. Specifically, a barrier metal layer 522 comprising Ti and a metal layer comprising Al are formed. Then, a photoresist layer (not illustrated) is formed at a predetermined position over the metal layer. Then, dry etching is performed by using the photoresist layer as a mask. Thus, third interconnects 520 are formed integrally with the second vias 440 simultaneously. As described above, an interconnect pattern to be connected with the gate electrode 450 can be formed by a lesser number of steps.

Then, a plurality of interconnect layers (not illustrated) are further formed over the third interconnect layer 500 in a not illustrated range. Electrode pads (pad 600, etc. to be described later) are formed in the interconnect layer at the uppermost interconnect layer of the multilayer interconnect layer. By the procedures described above, the semiconductor device 10 according to the first embodiment can be obtained.

Then, the effect of the first embodiment is to be described.

Then, it is assumed a case as a comparative example that the source electrode and the drain electrode are in contact with the semiconductor layer 460 on the same side as the gate electrode 450. In this case, the gate electrode 450 is provided between the source electrode and the drain electrode in the same interconnect layer. The source electrode and the drain electrode have to be formed being spaced from the gate electrode 450 in a plan view so as to prevent short circuit with the gate electrode 450. Therefore, the distance between the source electrode and the drain electrode tends to be longer necessarily. Therefore, a channel resistance between the source electrode and the drain electrode is increased.

On the contrary, according to the first embodiment, the semiconductor layer 460, the gate insulating film 470, the gate electrode 450, and the first via 340 form the active element 30. Among them, at least two first vias 340 are provided in the first interconnect layer 300 and are in contact by way of the upper ends thereof with the semiconductor layer 460. Thus, the active element 30 can be provided in the multilayer interconnect layer.

Further, in the first embodiment, the first vias 340 each as the source electrode and the drain electrode are provided in the first interconnect layer 300 positioned below the second interconnect layer 400 provided with the gate electrode 450. Thus, the first vias 340 as the source electrode and the drain electrode can be arranged optionally to the gate electrode 450. For example, the distance between the source electrode and the drain electrode can be shortened. Further, any of normally off type and normally on type FET can be formed.

Further, in the first embodiment, the step of forming the multilayer interconnect structure can be applied as it is except for the step of forming the semiconductor layer 460 and the gate insulating film 470. Accordingly, the active element 30 can be formed in the multilayer interconnect without greatly changing the manufacturing process.

As described above, the first embodiment can provide the semiconductor device 10 in which the active element 30 is provided in the multilayer interconnect layer and the chip area is decreased.

Description has been made to the first embodiment in which the lower interconnect layer 200, the first interconnect layer 300, the second interconnect layer 400, and the third interconnect layer 500 do not contain Cu. On the other hand, a Cu-containing interconnect layer may also be formed by a damascene process. For example, the first interconnect layer 300 may contain Cu. In other words, the first interconnect layer 300 may also be formed by a damascene process. In this case, the first interlayer insulating layer 310 in contact with the semiconductor layer 460 preferably contains a diffusion blocking layer (not illustrated). The semiconductor layer 460 is preferably in contact with the diffusion blocking layer of the first interlayer insulating layer 310.

In the first embodiment, description has been made for the first embodiment to a case where the semiconductor layer 460 is an oxide semiconductor. On the other hand, the semiconductor layer 460 may also be formed of an amorphous silicon or a polysilicon. In this case, impurities are preferably implanted in the source region and the drain region of the semiconductor layer 460.

Second Embodiment

Figure 9:
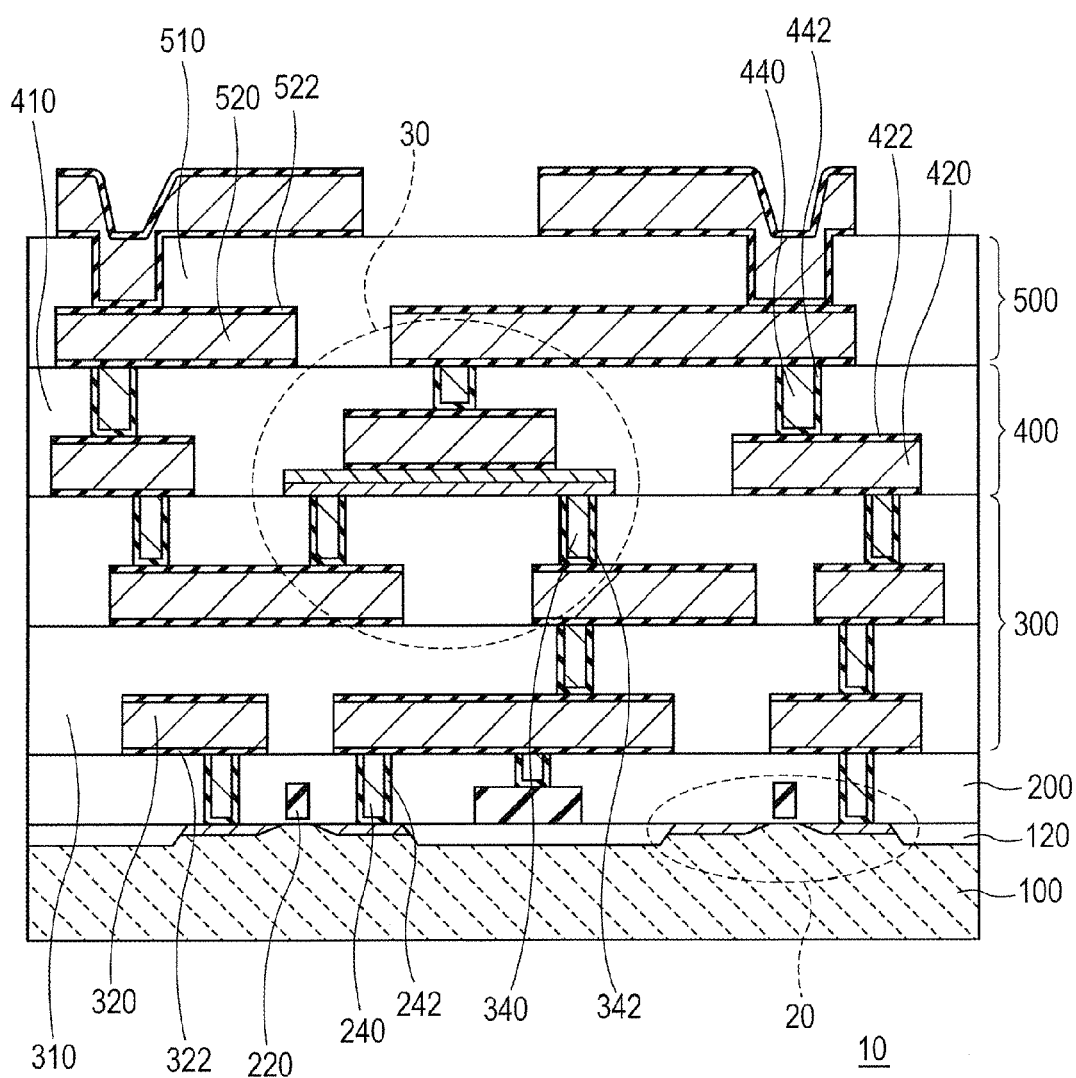
FIG. 9 is a cross sectional view showing a configuration of a semiconductor device according to a second embodiment.

FIG. 9 is a cross sectional view showing a configuration of a semiconductor device 10 according to a second embodiment. The second embodiment is identical with the first embodiment except that the third interconnect 520 is formed of a material different from that of the second vias 440. Description is to be made specifically.

At first, the configuration of a semiconductor device 10 according to the second embodiment is to be described. The structure from the substrate 100 to the gate electrode 450 and the second interconnect 420 is identical with that of the first embodiment.

As shown in FIG. 9, a second interlayer insulating layer 410 is provided in the second interconnect layer 400. The second interlayer insulating layer 410 is provided over the first interlayer insulating layer 310, the gate insulating film 470, and the gate electrode 450. Each of the second vias 440 is provided in the second interconnect layer 400 and are in contact by way of lower ends thereof with the gate electrode 450. The second via 440 is comprises, for example, W. Further, the upper surface of the second interconnect layer 400 is planarized by CMP. Thus, the upper surface of the second interlayer insulating layer 410 and the upper surface of the second via 440 are in flush with each other.

A third interconnect layer 500 is provided over the second interconnect layer 400. The third interconnects 520 are provided in the third interconnect layer 500. In this embodiment, the third interconnect 520 is in contact with the second vias 440 and composed of a material different from that of the second vias 440. In this embodiment, the third interconnect 520 comprises Al. A barrier metal layer 422 is provided to the upper layer and the lower layer of the third interconnect 520. The barrier metal layer 422 is composed, for example, of Ti.

A third interlayer insulating layer 510 is provided over the second interconnect layer 400 and the third interconnects 520. The interconnect layer in the layer above the third interconnect layer 500 is identical with that of the first embodiment.

The third interconnect layer 500 may be an interconnect layer containing only the third interconnects 520. In this case, the third interconnects 520 may also be formed of Cu by a damascene process.

Then, a method of manufacturing the semiconductor device 10 according to the second embodiment is to be described. The method of manufacturing the semiconductor device 10 according to the second embodiment is identical with that of the first embodiment except that the steps at or after forming the second vias 440 are different.

Description is to be made after the step of forming the gate electrode. A second interlayer insulating layer 410 is formed over the first interlayer insulating layer 310, the gate insulating film 470, and the gate electrode 450, for example, by CVD.

Then, the third via holes 446 are formed so as to be in contact with the gate electrode 450 in the second interlayer insulating layer 410 by RIE. Then, a barrier metal layer 442 is formed over the second interlayer insulating layer 410 and in the second via holes 446, for example, by sputtering. As the barrier metal layer 442, Ti is formed for example. Then, a metal is filled in the second via holes 446. In this embodiment, W is filled in the second via holes 446, for example, by CVD.

Then, the second interlayer insulating layer 410 is planarized by CMP. Thus, the second vias 440 are formed in the second interconnect layer 400.

Then, the third interconnects 520 are formed so as to be in contact with the second interlayer insulating layer 410 and the second vias 440. In this step, the barrier metal layer 422 comprising Ti, a metal layer comprising Al, and another barrier metal layer 422 comprising Ti are formed as the third interconnect 520.

The subsequent steps are identical with those of the first embodiment.

Then, the effect of the second embodiment is to be described.

The second embodiment can provide the same effect as the first embodiment. Further, the second embodiment can form an interconnect structure different from that of the first embodiment over the gate electrode 450. For example, the second via 440 may also be formed of a material different from that of the third interconnect 520. The third interconnects 520 are connected by way of the second vias 440 to the gate electrodes 450. Thus, the material for the second vias 440 can be selected optionally in accordance with the material of the gate electrodes 450. Further, the material of the third interconnects 520 can be selected from materials suitable to interconnects, for example, having low resistance.

Third Embodiment

Figure 10A:
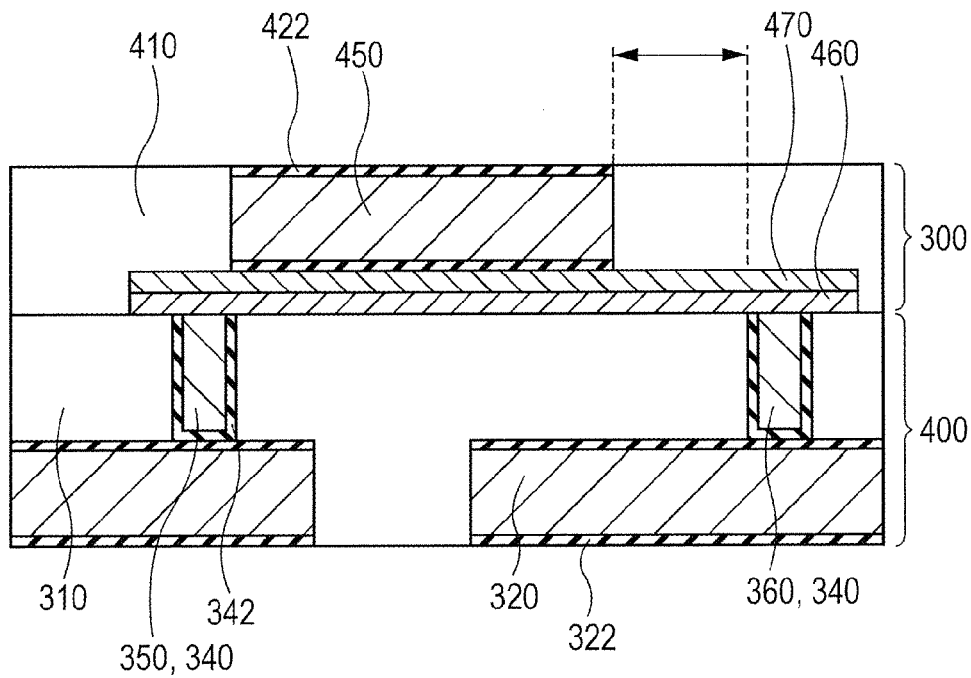
FIG. 10A is a cross sectional view of the active element according to a third embodiment.
Figure 10B:
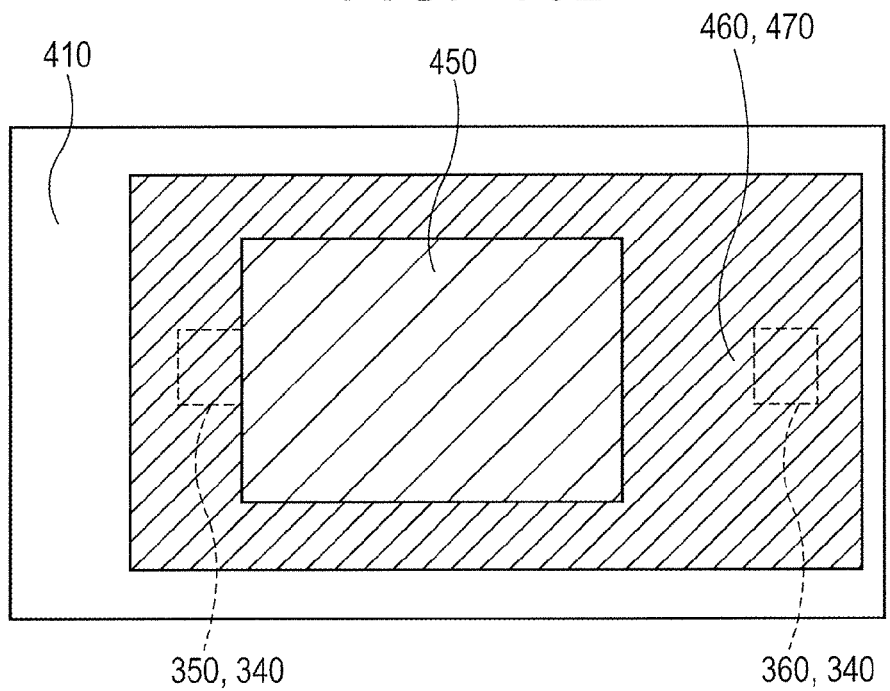
FIG. 10B is a plan view of the active element according to the third embodiment.

FIG. 10 is a view showing a configuration of an active element 30 according to a third embodiment. FIG. 10A is a cross sectional view of an active element 30. FIG. 10B is a plan view of the active element 30. The third embodiment is identical with the first embodiment except that the arrangement of the first vias 340 is different. Details are to be described specifically.

In the first interconnect layer 300, at least two first vias 340 are provided. One of the first vias 340 is a source electrode 350 and the other of the first vias 340 is a drain electrode 360 positioned on the side opposite to the source electrode 350 with a portion of the gate electrode 450 being put therebetween in a plan view. It is not always necessary that the source electrode 350 overlaps with the gate electrode 450 in a plan view.

In the third embodiment, the distance between the drain electrode 360 and the center of the gate electrode 450 in a plan view is longer than the distance between the source electrode 350 and the center of the gate electrode 450 in a plan view. For example, the source electrode 350 is provided adjacent to the gate electrode 450 in a plan view. On the other hand, the drain electrode 360 is provided being spaced from the gate electrode 450 in a plan view. Thus, dielectric breakdown of the active element 30 can be suppressed when a high voltage is applied to the drain electrode 360.

The third embodiment can provide the same effect as the first embodiment. Further, according to the third embodiment, the distance between the drain electrode 360 and the center of the gate electrode 450 in the plan view is longer than the distance between the source electrode 350 and the center of the gate electrode 450 in the plan view. Thus, the withstanding voltage of the active element 30 can be increased.

Fourth Embodiment

Figure 11A:
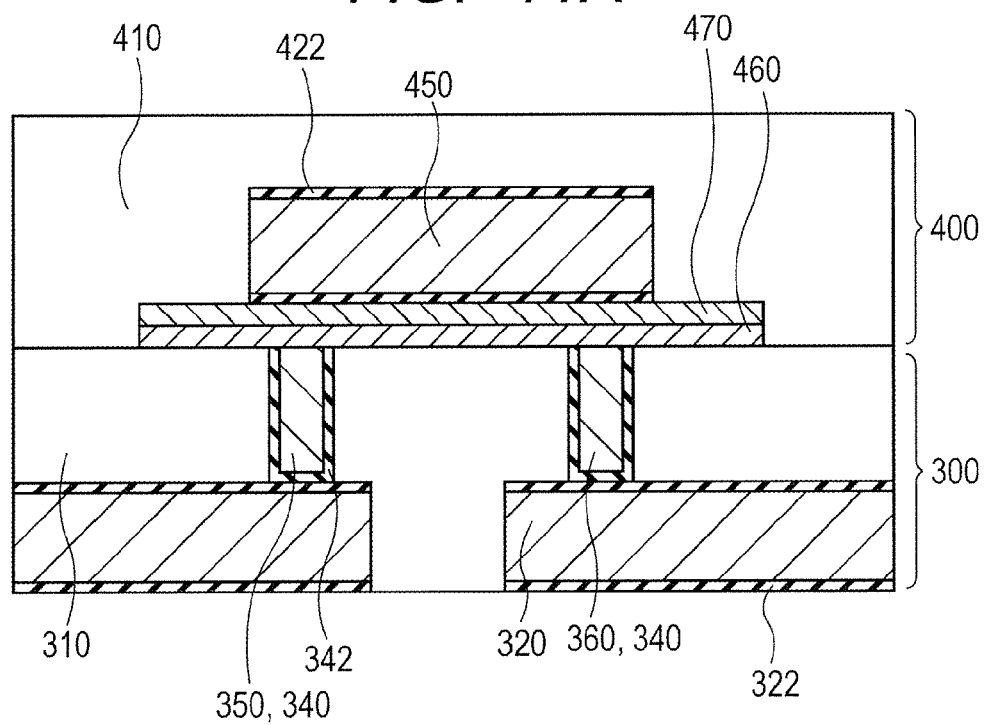
FIG. 11A is a cross sectional view of the active element according to a fourth embodiment.
Figure 11B:
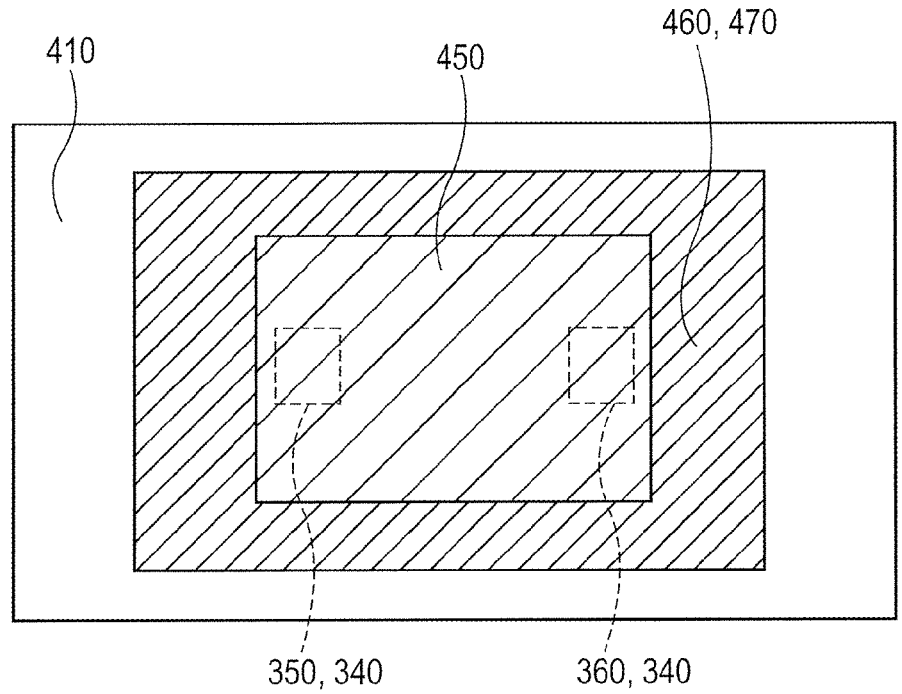
FIG. 11B is a plan view of the active element according to the fourth embodiment.

FIG. 11 is a view showing a configuration of an active element 30 according to a fourth embodiment. FIG. 11A is a cross sectional view of the active element 30. FIG. 11B is a plan view of the active element 30. The fourth embodiment is identical with the first embodiment except that arrangement of the first vias 340 is different. details are to be described specifically.

As shown in FIG. 11, at least one first via 340 partially overlaps with a portion of the gate electrode 450, for example, in a plan view. As described above, the distance between the source electrode 350 and the drain electrode 360 is narrower than the width of the gate electrode 450.

According to the fourth embodiment, at least two first vias 340 are formed in a range of the gate electrode 450 in a plan view. In this embodiment, both of a source electrode 350 and a drain electrode 360 are formed within a region of a gate electrode in a plan view. In other words, the entire portion of the first vias 340 overlaps with the gate electrode 450 in a plan view.

The fourth embodiment can provide the same effect as the first embodiment. Further, according to the fourth embodiment, at least two first vias 340 are formed within a range of the gate electrode 450 in a plan view. This can improve the characteristic of the active element 30. Specifically, a large drain current can be obtained at a low threshold voltage.

Fifth Embodiment

Figure 12:
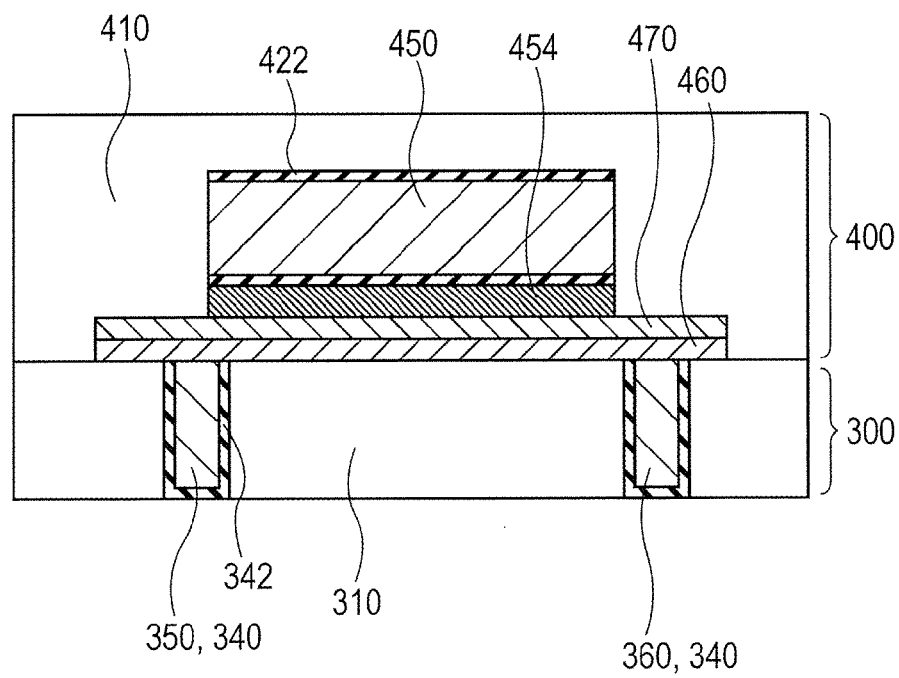
FIG. 12 is a cross sectional view showing a configuration of an active element according to a fifth embodiment.

FIG. 12 is a cross sectional view showing a configuration of an active element 30 according to a fifth embodiment. The fifth embodiment is identical with the first embodiment except that a gate contact layer 454 is provided. Details are to be described specifically.

The gate electrode 450 has a gate contact layer 454 in contact with the gate insulating film 470. The gate contact layer 454 is a portion of the gate electrode 450. The gate contact layer 454 is formed, for example, of a material different from that of the second interconnects 420. A metal layer having the same configuration as the second interconnect 420 is provided over the gate contact layer 454. That is, a gate electrode 450 having barrier metal layers 422 each as the upper layer and as the lower layer is provided over the gate contact layer 454.

The gate contact layer 454 can be selected in accordance with the semiconductor layer 460. Specifically, the gate contact layer 454 contains Ti, TiN, TiN/Ti, Ti/TiN, Ta, TaN, TaN/Ta, Ta/TaN, W, WN, W/TiN, WTi, TiSi, TaSi, WSi, TaC, TiC, WC, or Cu. Thus, the work function of the gate electrode 450 can be adjusted to set the threshold voltage of the active element 30 to a desired voltage.

The fifth embodiment can provide the same effect as the first embodiment. Further, according to the fifth embodiment, the gate contact layer 454 is provided to a portion where the gate electrode 450 is in contact with the semiconductor layer 460. Thus, the gate contact layer 454 can be formed of a material suitable to the semiconductor layer 460. Accordingly, it is possible to adjust the work function of the gate electrode 450 and the threshold voltage of the active element 30 can be set to a desired voltage.

Sixth Embodiment

Figure 13:
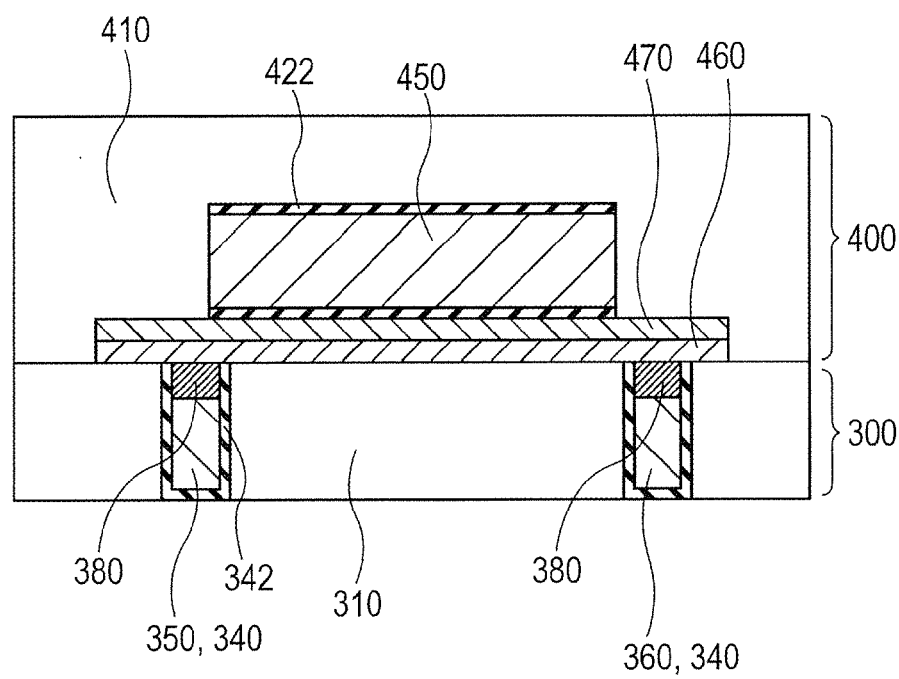
FIG. 13 is a cross sectional view showing a configuration of an active element according to a sixth embodiment.
Figure 14:
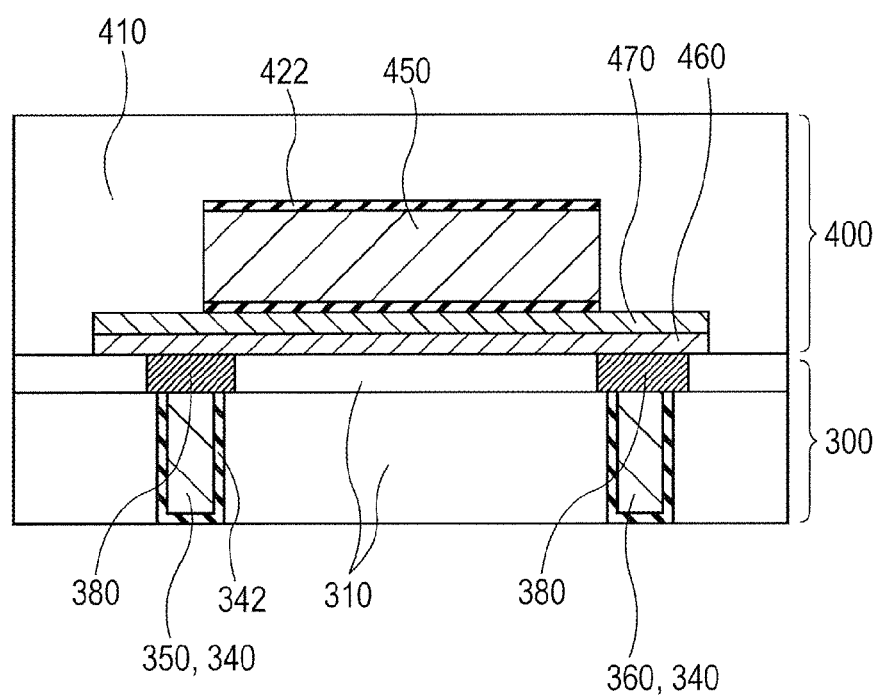
FIG. 14 is a cross sectional view showing a configuration of an other active element according the sixth embodiment.

FIG. 13 and FIG. 14 are cross sectional views showing the configuration of an active element 30 of a sixth embodiment. The sixth embodiment is identical with the first embodiment except that via contact layers 380 are provided. Details are to be described specifically.

Via contact layers 380 are provided over first vias 340. The first vias 340 are in contact by way of the via contact layers 380 with a semiconductor layer 460. Specifically, both of a source electrode 350 and a drain electrode 360 are in contact by way of the via contact layers 380 with a semiconductor layer 460 respectively.

The via contact layer 380 is formed of a material having a low contact resistance to the semiconductor layer 460. The via contact layer 380 is more preferably in ohmic contact with the semiconductor layer 460. Further, also when the via contact layer 380 is refined, the via contact layer 380 is preferably formed of a stable material. Specifically, the via contact layer 380 comprises Ti, TiN, Mo, Ta, or TaN. Thus, even when the semiconductor layer 460 is an oxide semiconductor, the contact resistance can be lowered. Further, even when the via contact layer 380 is refined, failure such as interlayer peeling or migration can be suppressed.

In a specific structure, as shown in FIG. 13, the via contacts layer 380 are provided to the upper end of the first vias 340. The lateral side of the contact layer 380 and the lateral side on the lower side of the via 340 are in flush with each other. Further, the barrier metal layer 342 is formed integrally on each of the lateral sides of the via contact layers 380 and the lower lateral sides of the first vias 340.

Alternatively, as shown in FIG. 14, the via contact layers 380 may be provide as a separate interconnect layer. The first via 340 of the lower layer and the via contact layer 380 form the source electrode 350 or the drain electrode 360. The via contact layer 380 is provided so as to overlap with the first via 340 of the lower layer in a plan view. For example, the planar area of the via contact layer 380 may be larger than the first via 340 of the lower layer. In this case, the barrier metal layer 342 may not be present on the lateral side of the via contact layer 380. In the case of FIG. 14, it may be considered that the entire first via 340 in contact with the semiconductor layer 460 comprises the via contact layer 380.

The sixth embodiment can provide the same effect as the first embodiment. Further, according to the sixth embodiment, the first via 340 is in contact with the semiconductor layer 460 by way of the via contact layer 380. Thus, the characteristic of the active element 30 can be improved. For example, the contact resistance between the via contact layer 380 and the semiconductor layer 460 can be lowered.

Seventh Embodiment

Figure 15A:
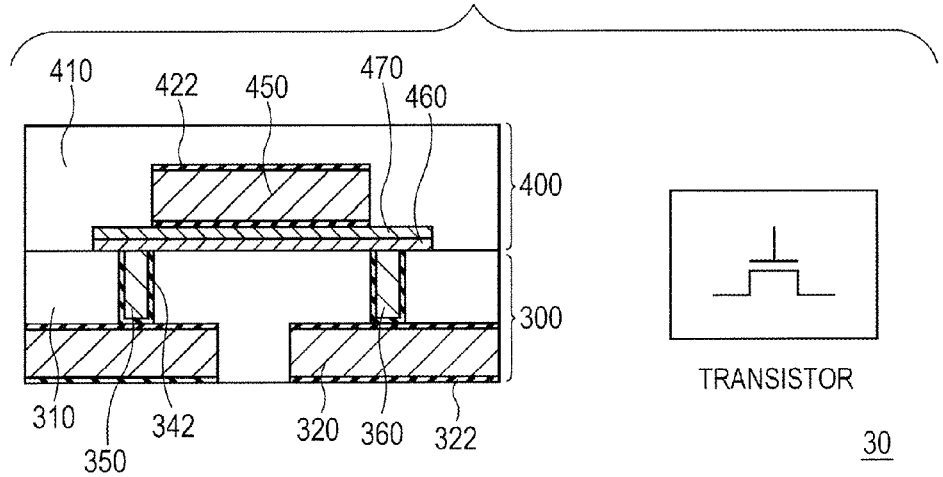
FIG. 15A is a cross sectional view showing a transistor according to a seventh embodiment.

FIGS. 15A, B, C are views showing a configuration an active element according to a seventh embodiment. The seventh embodiment is identical with the first embodiment except that the active element is a second transistor. Details are to be described specifically.

FIG. 15A shows an active element 30 in the first embodiment. First vias 340 as a source electrode 350 and a drain electrode 360 are in contact by way of upper ends thereof with a semiconductor layer 460. The active element 30 is a "second transistor".

Figure 15B:
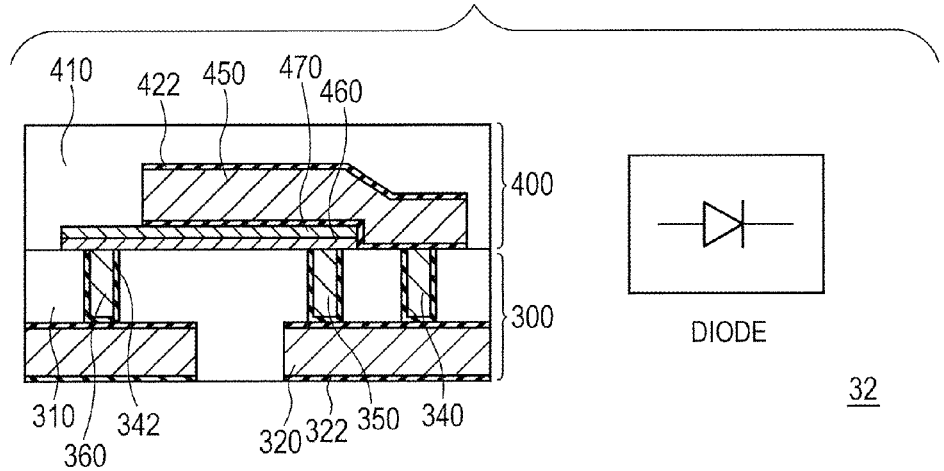
FIG. 15B is a cross sectional view showing a diode according to the seventh embodiment.

FIG. 15B shows an embodiment in which an active element 32 is a diode. At least two first vias 340 are in contact by way of upper ends thereof with the semiconductor layer 460. One of the first vias 340 is a source electrode 350. The other of the first vias 340 is a drain electrode 360 positioned on the side opposing the source electrode 350 with a portion of the gate electrode 450 being put therebetween in a plan view.

A gate electrode 450 extends to the outside from the semiconductor layer 460 and a gate insulating film 470 in a plan view. First vias 340 are provided to the extended portion of the gate electrode 450 in a plan view. The first vias 340 are connected to a first interconnect 320. The source electrode 350 is connected by way of the first interconnect 320 and the first via 340 to the extended portion of the gate electrode 450. Thus, the source electrode 350 is short-circuited with the gate electrode 450.

As described above, the gate electrode 450, the gate insulating film 470, the semiconductor layer 460, the source electrode 350, and the drain electrode 360 form a "diode".

Figure 15C:
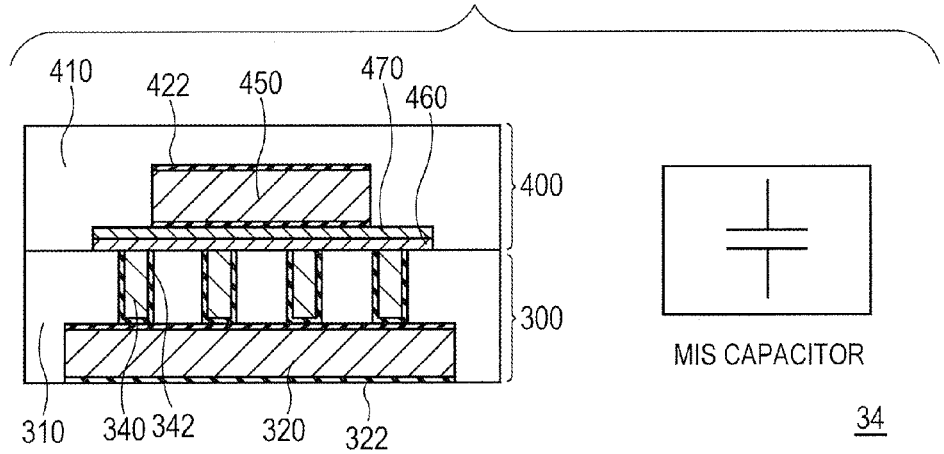
FIG. 15C is a cross sectional view showing a capacitor according to the seventh embodiment.

FIG. 15C also shows a case in which an active element 34 is a capacitor element. A plurality of first vias 340 are in contact by way of upper ends thereof with a semiconductor layer 460. All of the first vias 340 are provided so as to overlap with the semiconductor layer 460 in a plan view. All of the first vias 340 are connected to an identical first interconnect 320.

As described above, the gate electrode 450, the gate insulating film 470, the semiconductor layer 460, and the first vias 340 form a "capacitor element".

The seventh embodiment can provide the same effect as the first embodiment. Further, according to the seventh embodiment, the active element can provide various functions. For example, the active element can be served as a diode or a capacitor element. Accordingly, a circuit having a plurality of active elements can be formed in the multilayer interconnect. Further, there is no requirement of adding any particular step for forming the active element compared when with the first embodiment.

Eighth Embodiment

Figure 16:
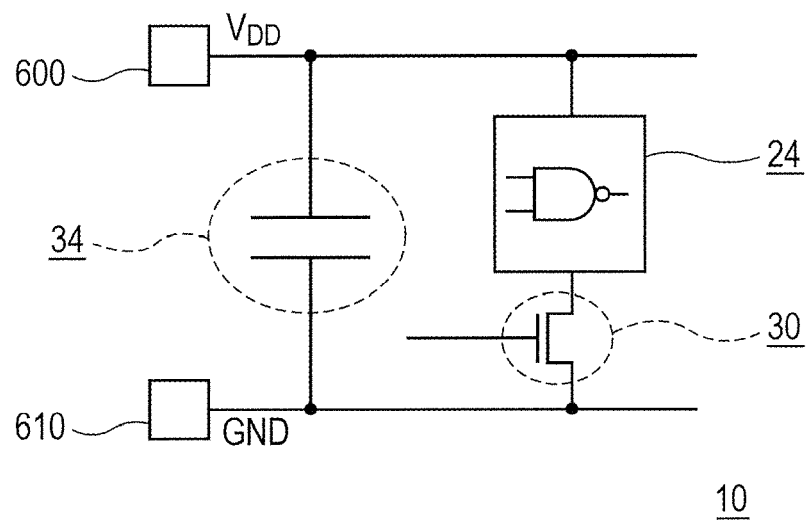
FIG. 16 is a circuit diagram showing a configuration of a semiconductor device according to an eighth embodiment.

FIG. 16 is a circuit diagram showing a configuration of a semiconductor device according to an eighth embodiment. The eighth embodiment is identical with the first embodiment except that the active element forms a power source switch.

In the same manner as in the first embodiment, a first transistor 20 is provided near the surface layer of a substrate 100. An internal circuit 24 includes a first transistor 20. The internal circuit 24 is, for example, NAND circuit. In addition, the internal circuit 24 may also be an NOR or NOT circuit. Details are to be described specifically.

Electrode pads are provided in the uppermost interconnect layer of the multi-interconnect layer. One of the electrode pads, i.e., an electrode pad 600 supplies a signal to the internal circuit 24. The signal is, for example, a power source voltage ($V_{DD}$). The other of the electrode pads is a ground pad 610. The ground pad 610 supplies a ground potential (GND).

A semiconductor layer 460, a gate insulating film 470, a gate electrode 450, and a first via 340 form a second transistor (active element 30). The internal circuit 24 is connected by way of the second transistor to the electrode pads 610. In this embodiment, one end of the internal circuit 24 is connected by way of the second transistor to the ground pad 610. The other end of the internal circuit 24 is connected to the electrode pad 600 for supplying the power source voltage.

For example, the semiconductor layer 460, the gate insulating film 470, the gate electrode 450, and the first via 340 not contained in the active element 30 form a capacitor element (active element 34). The capacitor element is connected between the electrode pad 600 and the ground pad 610. Thus, the power source voltage can be stabilized.

In this embodiment, the semiconductor layer 460, etc. configuring the second transistor and the capacitor element are provided in an identical second interconnect layer. The second transistor is provided at a position different from the capacitor element in a plan view. Thus, a plurality of active elements can be formed by adding only one step of forming the semiconductor layer 460 and the gate insulating film 470.

As described above, the internal circuit 24 including the first transistor 20, the active element 30 as the second transistor, and the active element 34 as the capacitor element form an electric power switch. The electric power switch is provided in one identical semiconductor chip.

The eighth embodiment can provide the same effect as the first embodiment. Further, according to the eighth embodiment, various circuits can be formed in one identical semiconductor device 10 by combining the internal circuit 24 provided to the substrate 100 and an active element 30 provided in the multilayer interconnect. Accordingly, not only the chip area of the semiconductor device 10 can be decreased but also the number of the semiconductor devices can be decreased as an entire product.

Ninth Embodiment

Figure 17:
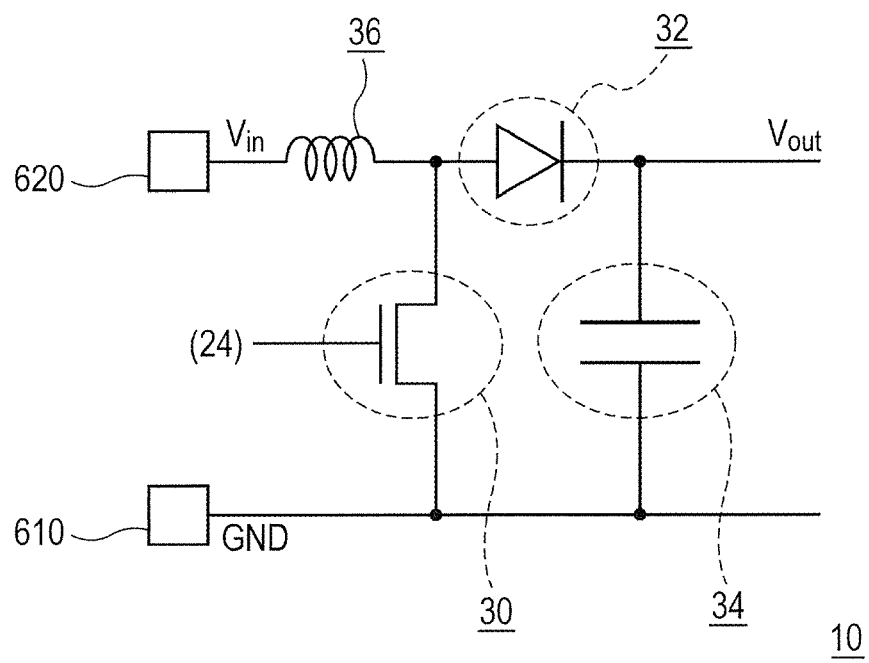
FIG. 17 is a circuit diagram showing a configuration of a semiconductor device according to a ninth embodiment.

FIG. 17 is a circuit diagram showing a configuration of a semiconductor device 10 according to a ninth embodiment. The ninth embodiment is identical with the first embodiment or the eighth embodiment except that the active element forms a DC-DC converter. Details are to be described specifically.

The semiconductor device 10 according to the ninth embodiment includes an internal circuit 24, a second transistor (active element 30), a diode (active element 32), a capacitor element (active element 34), and an inductor 36. The second transistor (active element 30), the diode (active element 32), and the capacitor element (capacitor element 34) are provided at different positions, for example, in a plan view.

Electrode pads are provided in the uppermost interconnect layer of the multilayer interconnect layer. One of the electrode pads is an I/O pad 620 for supplying a signal to the internal circuit 24. The other of the electrode pads is a ground pad 610. The ground pad 610 supplies a ground potential (GND).

The inductor 36 is connected to the I/O pad 620. The inductor 36 is connected by way of the second transistor (active element 30) to the ground pad 610. The inductor 36 is, for example, a second interconnect 420 formed in a spiral shape. The inductor 36 may also be formed over a plurality of interconnect layers.

A gate electrode 450 of the second transistor (active element 30) is connected to the internal circuit 24. The internal circuit 24 controls the switching operation of the second transistor.

In the active element 32, a source electrode 350 is short-circuited with the drain electrode 360. Thus, the gate electrode 450, a gate insulating film 470, a semiconductor layer 460, a source electrode 350, and a drain electrode 360 form a "diode".

The diode (active element 32) is connected between the I/O pad 620 and the ground pad 610 such that the direction from the I/O pad 620 to the ground pad 610 is in a forward direction. In this embodiment, the diode (active element 32) is connected between the inductor 36 and the second transistor (active element 30). The diode (active element 32) is connected by way of the capacitor element (active element 34) to the ground pad 610.

As described above, the internal circuit 24, the active element 30, etc. form a DC-DC converter. The DC-DC converter of the ninth embodiment increases a voltage ($V_{in}$) between the I/O pad 620 and the ground pad 610 to a higher voltage ($V_{out}$).

The ninth embodiment can provide the same effect as that the first embodiment or the eighth embodiment.

Tenth Embodiment

Figure 18:
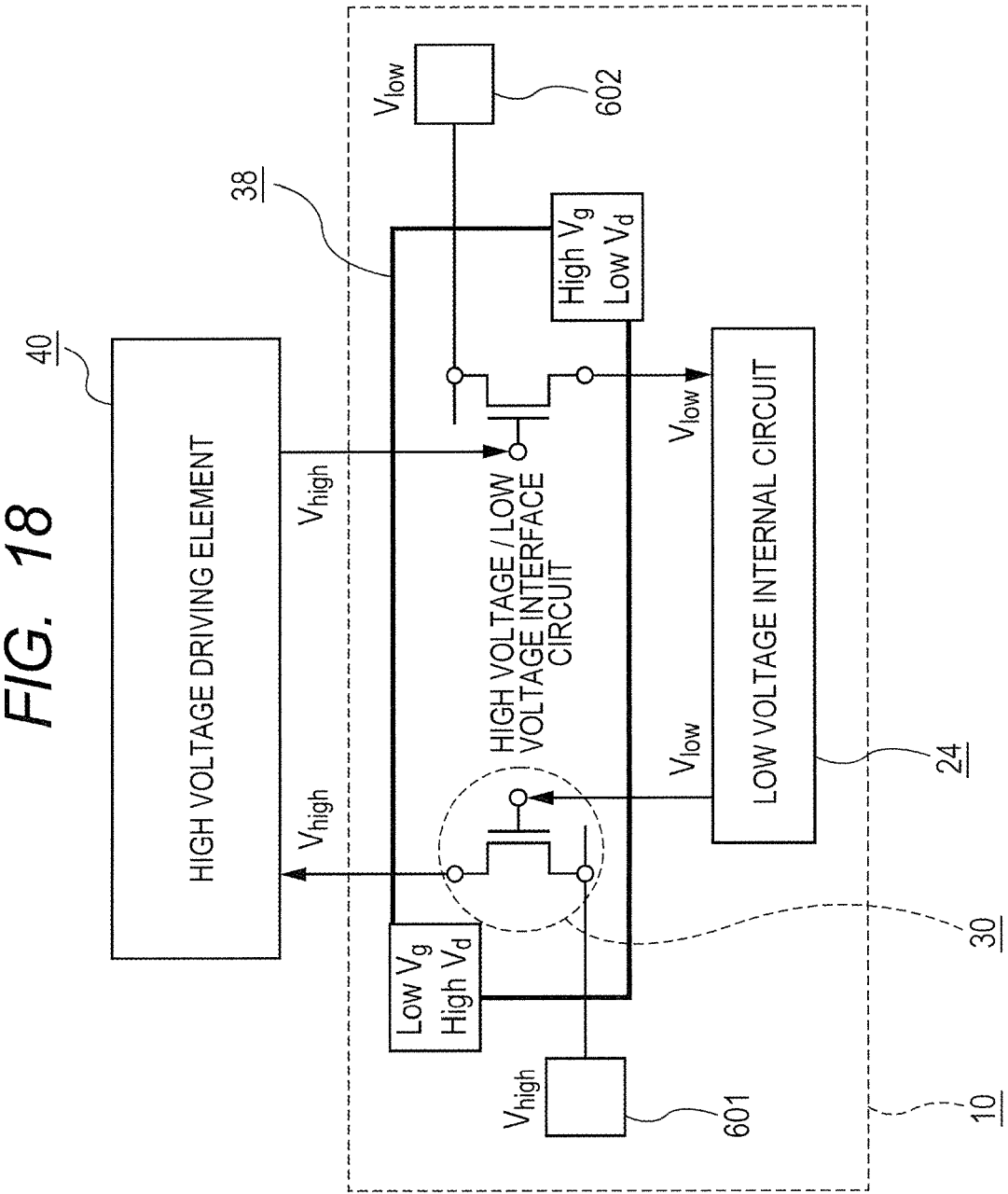
FIG. 18 is a circuit diagram showing a configuration of a semiconductor device according to a tenth embodiment.

FIG. 18 is a circuit diagram showing the configuration of a semiconductor device 10 according to a tenth embodiment. The tenth embodiment is identical with the first, eighth, or ninth embodiment except that the active element forms an interface circuit. Details are to be described specifically.

The semiconductor device 10 has a first electrode pad 601, a second electrode pad 602, an interface circuit 38, and an internal circuit 24. The internal circuit 24 is, for example, an MCU (Micro Control Unit) driven at a low voltage. The semiconductor device 10 is connected to a driving element 40 driven at a high voltage. The driving element 40 is provided to the outside of the semiconductor device 10.

The first electrode pad 601 supplies a first voltage ($V_{high}$). On the other hand, the second electrode pad 602 supplies a second voltage ($V_{low}$) lower than the first voltage.

The interface circuit 38 is connected to the first electrode pad 601 and the second electrode pad 602. Further, the interface circuit 38 includes a second transistor (active element 30).

The internal circuit 24 is connected by way of the interface circuit 38 to the driving device driven at the first voltage ($V_{high}$). For example, a drain electrode 360 of at least one second transistor (active element 30) is connected to the first electrode pad 601. A source electrode 350 of the second transistor (active element 30) is connected to the driving device 40. A gate electrode 450 of the second transistor is connected to the internal circuit 24.

On the other hand, a source electrode 350 of other second transistor (active element 30) included in the interface circuit 38 is connected to the second electrode pad 602. A drain electrode 360 of the second transistor is connected to the internal circuit 24. A gate electrode 450 of the second transistor is connected to the driving device 40.

The interface circuit 38 supplies a first voltage ($V_{high}$) to the driving device 40 based on the signal from the internal circuit 24. Further, the interface circuit 38 supplies a second voltage ($V_{low}$) to the internal circuit 24 based on the signal from the driving device 40.

The tenth embodiment can provide the same effect as the first, eighth, and ninth embodiments. Further, in the tenth embodiment, the active element 30 forms the interface circuit 38. Thus, the internal circuit 24 can drive the driving device 40 by way of the interface circuit 38. Further, the driving device 40 can transfer a signal to the internal circuit 24 by way of the interface circuit 38.

Eleventh Embodiment

Figure 19:
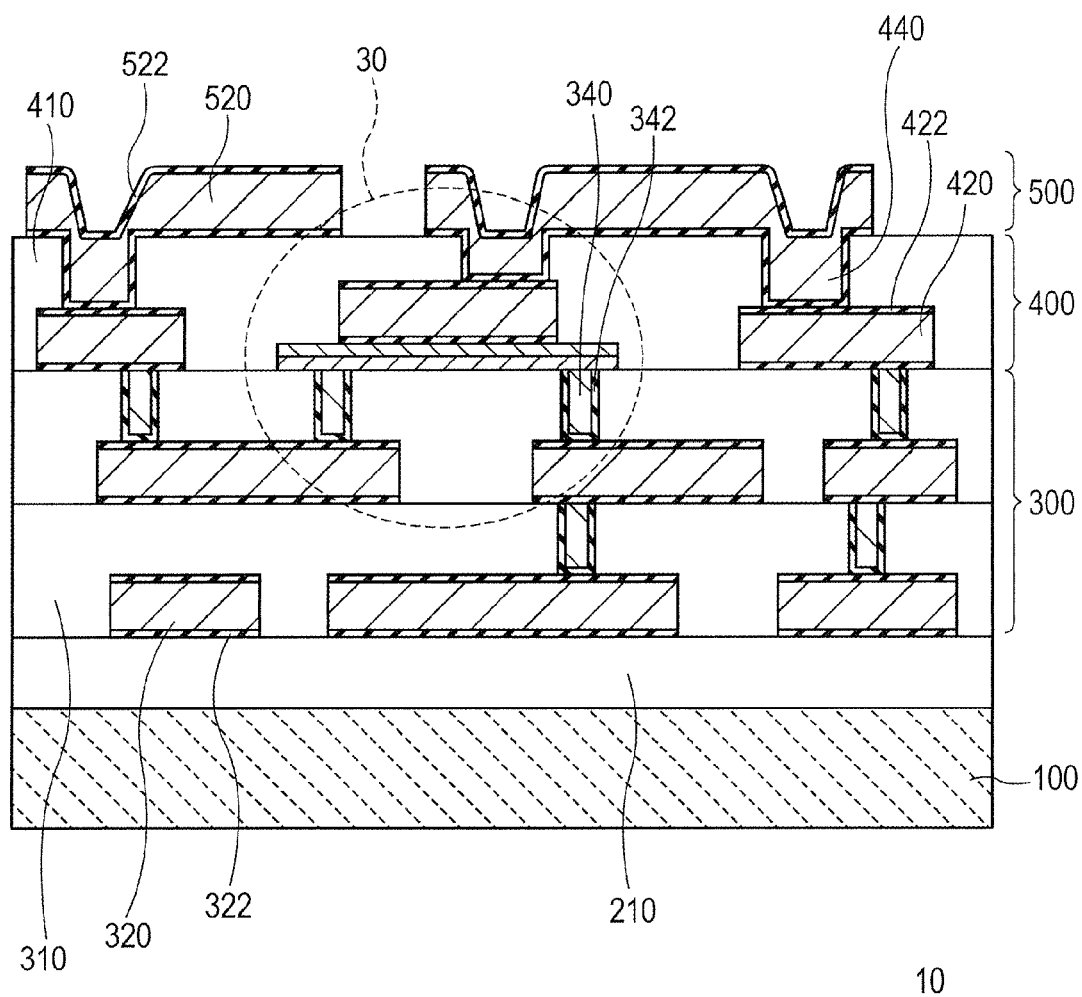
FIG. 19 is a cross sectional view showing a configuration of a semiconductor device according to an eleventh embodiment.

FIG. 19 is a cross sectional view showing a configuration of a semiconductor device according to an eleventh embodiment. The eleventh embodiment is identical with the first embodiment except that a substrate 100 is not a semiconductor substrate. Details are to be described specifically.

For the series of the embodiments described above, description has been made to a case where the first transistor 20 is formed to the substrate 100 and the active element 30 is formed in the multilayer interconnect layer. However, as shown in the eleventh embodiment, the substrate 100 may not be the semiconductor substrate.

Any material capable of physically supporting the multilayer interconnects may be used as the substrate 100 in the eleventh embodiment. That is, the substrate 100 may be a metal substrate or an insulating substrate. Specifically, the metal substrate comprises, for example, Au, Cu, Ti, Fe, or an alloy comprising them. Further, the insulating substrate may comprise glass ($SiO_2$), Polymeric resin, plastic, silicone resin, or a composite material thereof.

As shown in FIG. 19, a lower interlayer insulating layer 210 may be provided over the substrate 100. Thus, when the substrate 100 is a metal substrate, an insulation can be ensured between the first interconnect layer 300 and the substrate 100. Further, when unevenness of about several nm is present on the surface of the substrate 100, the lower interlayer insulating layer 210 can be served as a planarizing layer or a adhesion reinforcing layer.

Other configurations are identical with those of the first embodiment.

The eleventh embodiment can provide the same effect as the first embodiment. Further, the eleventh embodiment is applicable also in a case where the substrate 100 is formed of various materials.

While the invention has been made to the preferred embodiments with reference to the drawings, they are merely examples of the invention and various other configurations than those described above can also be adopted.

What is claimed is:

1. A method of manufacturing a semiconductor device comprising:
   forming a first interlayer insulating layer over a substrate;
   forming a plurality of first vias in the first interlayer insulating layer;
   forming a semiconductor layer so as to be in contact with the first interlayer insulating layer and at least two of the first vias and overlap with the at least two first vias in a plan view;
   forming a gate insulating film over the semiconductor layer; and
   forming a gate electrode over the gate insulating film,
   wherein the semiconductor layer is not in contact with a third one of the first vias, and does not overlap with the third first via in a plan view such that the semiconductor layer is not in vertical registration with the third one of the first vias.

2. The method of manufacturing a semiconductor device according to claim 1,
   wherein a second interconnect is arranged at a position different from that of the gate electrode in a plan view and formed simultaneously with at least a portion of the gate electrode in the gate electrode forming step, and the second interconnect is in vertical registration with the third first via.

3. The method of manufacturing a semiconductor device according to claim 1,
   wherein the gate insulating film is patterned so as to leave a portion overlapping with the first vias in a plan view in the gate insulating layer forming step, and
   wherein the semiconductor layer is selectively removed after the step of forming the gate insulating film by using the patterned gate insulating film as a mask.

4. The method of manufacturing a semiconductor device according to claim 1, further comprising:
   applying a plasma treatment to the upper surface of the first vias by an inert gas after the step of forming the first vias and before the step of forming the semiconductor layer.

5. The method of manufacturing a semiconductor device according to claim 1, further comprising:
   forming a second interlayer insulating layer over the first interlayer insulating layer, the gate insulating film, and the gate electrode;
   forming second via holes in the second interlayer insulating layer so as to be in contact with the gate electrode; and
   filling the second via holes thereby forming second vias in contact with the gate electrode and forming a third interconnect positioned over the second interlayer insulating layer integrally with the second vias.

6. The method of manufacturing a semiconductor device according to claim 1, further comprising:
   forming a second interlayer insulating layer over the first interlayer insulating layer, the gate insulating film, and the gate electrode;
   forming second via holes in the second interlayer insulating layer so as to be in contact with the gate electrode;
   filling a metal in the second via holes and planarizing the surface of the second interlayer insulating layer thereby forming second vias; and
   forming a third interconnect so as to be in contact with the second interlayer insulating layer and the second vias.

7. The method of manufacturing a semiconductor device according to claim 1, wherein the semiconductor layer is an oxide semiconductor.

8. The method of manufacturing a semiconductor device according to claim 1, wherein the semiconductor layer is a metal oxide having a resistivity of 100 $\Omega$cm or less.

9. The method of manufacturing a semiconductor device according to claim 1, wherein the semiconductor layer is deposited directly on the first interconnect layer.

10. The method of manufacturing a semiconductor device according to claim 1, wherein the semiconductor layer is deposited directly on the first interconnect layer at a temperature of 400° C. or lower.

11. A method of manufacturing a semiconductor device comprising:
    forming a first interlayer insulating layer over a substrate;
    forming at least two first vias in the first interlayer insulating layer;
    forming a semiconductor layer so as to be in contact with the first interlayer insulating layer and the first vias and overlap with the first vias in a plan view;
    forming a gate insulating film over the semiconductor layer; and
    forming a gate electrode over the gate insulating film,
    wherein the gate insulating film is patterned so as to leave a portion overlapping with the first vias in a plan view in the gate insulating layer forming step, and
    wherein the semiconductor layer is selectively removed after the step of forming the gate insulating film by using the patterned gate insulating film as a mask.

12. A method of manufacturing a semiconductor device comprising:
    forming a first interlayer insulating layer over a substrate;
    forming at least two first vias in the first interlayer insulating layer;
    applying a plasma treatment to an upper surface of the first vias by an inert gas after the step of forming the first vias;
    after the step of applying a plasma treatment, forming a semiconductor layer so as to be in contact with the first interlayer insulating layer and the first vias and overlap with the first vias in a plan view;
    forming a gate insulating film over the semiconductor layer; and
    forming a gate electrode over the gate insulating film.

* * * * *